(12) United States Patent
Matsuura

(10) Patent No.: US 9,871,127 B2
(45) Date of Patent: *Jan. 16, 2018

(54) SEMICONDUCTOR DEVICE AND METHOD FOR MANUFACTURING THE SAME

(71) Applicant: RENESAS ELECTRONICS CORPORATION, Tokyo (JP)

(72) Inventor: Hitoshi Matsuura, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/151,112

(22) Filed: May 10, 2016

(65) Prior Publication Data

US 2016/0365433 A1  Dec. 15, 2016

(30) Foreign Application Priority Data

Jun. 10, 2015 (JP) .................................. 2015-117796

(51) Int. Cl.
*H01L 29/73* (2006.01)
*H01L 29/739* (2006.01)
(Continued)

(52) U.S. Cl.
CPC ...... *H01L 29/7396* (2013.01); *H01L 29/0619* (2013.01); *H01L 29/0696* (2013.01);
(Continued)

(58) Field of Classification Search
None
See application file for complete search history.

(56) References Cited

U.S. PATENT DOCUMENTS 7,633,122 B2 * 12/2009 Otsuki ............... H01L 29/7397
257/330
8,633,510 B2   1/2014 Matsuura et al.
(Continued)

FOREIGN PATENT DOCUMENTS

EP   2613356 A2   7/2013
JP   2006210547 A  8/2006
(Continued)

OTHER PUBLICATIONS

Extended European Search Report issued in corresponding European Patent Application No. 16150746.2, dated Jul. 7, 2016.

*Primary Examiner* — Michael Lebentritt
(74) *Attorney, Agent, or Firm* — McDermott Will & Emery LLP

(57) ABSTRACT

A semiconductor device includes trench gate electrodes, an emitter coupling section that couples them with each other, an interlayer insulating film arranged in a hybrid sub-cell region and an inactive cell region, and a contact trench penetrating it. Also, the contact trench is divided in a crossing region of extending directions of the hybrid sub-cell region and the emitter coupling section. Further, an $n^+$-type emitter region is disposed so as to be apart from an end of the divided contact trench. With such configuration of not forming the contact trench in the crossing region, the working failure of the contact trench can be reduced. Also, because the $n^+$-type emitter region is disposed so as to be apart from the end of the contact trench, the breakdown resistance of the semiconductor device can be improved.

20 Claims, 37 Drawing Sheets

(51) Int. Cl.
  H01L 29/66    (2006.01)
  H01L 29/423   (2006.01)
  H01L 29/06    (2006.01)
  H01L 29/10    (2006.01)
  H01L 29/40    (2006.01)

(52) U.S. Cl.
  CPC ........ H01L 29/407 (2013.01); H01L 29/4238 (2013.01); H01L 29/66348 (2013.01); H01L 29/7397 (2013.01); H01L 29/1095 (2013.01); H01L 29/402 (2013.01); H01L 29/6634 (2013.01)

(56) References Cited

U.S. PATENT DOCUMENTS

| | | | | |
|---|---|---|---|---|
| 9,041,050 B2* | 5/2015 | Matsuura | ........ | H01L 29/66348 257/139 |
| 9,391,135 B1* | 7/2016 | Grivna | ........ | H01L 29/7397 |
| 2005/0051832 A1* | 3/2005 | Fukumura | ........ | H01L 27/115 257/314 |
| 2010/0193836 A1 | 8/2010 | Okuno et al. | | |
| 2011/0233684 A1* | 9/2011 | Matsushita | ........ | H01L 29/1095 257/378 |
| 2013/0001638 A1 | 1/2013 | Yoshikawa | | |
| 2013/0049105 A1 | 2/2013 | Omori | | |
| 2013/0328105 A1 | 12/2013 | Matsuura | | |
| 2015/0123238 A1* | 5/2015 | Jang | ........ | H01L 27/10864 257/503 |
| 2015/0340480 A1* | 11/2015 | Matsuura | ........ | H01L 29/7813 257/144 |
| 2016/0099290 A1* | 4/2016 | Asao | ........ | H01L 45/085 257/4 |
| 2016/0141402 A1* | 5/2016 | Hosokawa | ........ | H01L 29/0834 257/144 |
| 2016/0276450 A1* | 9/2016 | Kobayashi | ........ | H01L 29/4236 |
| 2016/0284824 A1* | 9/2016 | Nagata | ........ | H01L 29/407 |
| 2016/0293427 A1* | 10/2016 | Mihara | ........ | H01L 27/11573 |

FOREIGN PATENT DOCUMENTS

| | | |
|---|---|---|
| JP | 2012256839 A | 12/2012 |
| JP | 2013-140885 A | 7/2013 |
| JP | 2013-258190 A | 12/2013 |

* cited by examiner

FIG. 8A
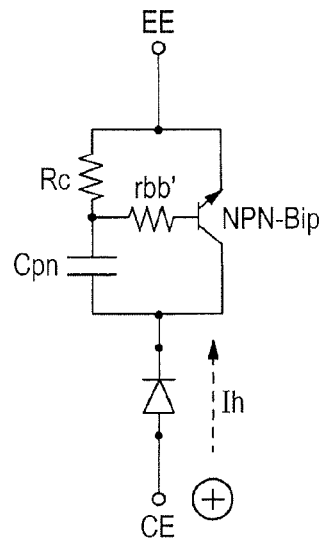
FIG. 8B
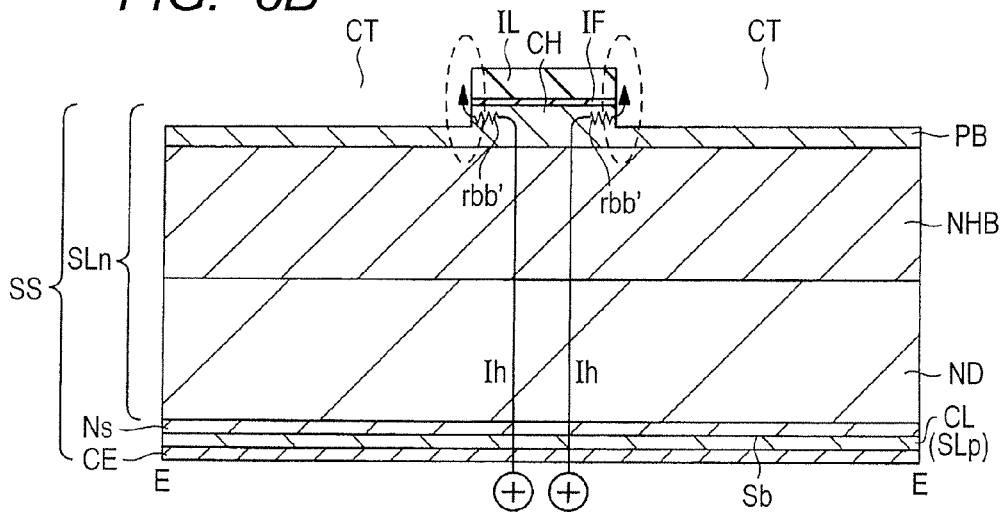
FIG. 8C1 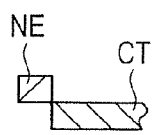
FIG. 8C2 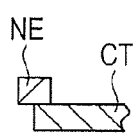
FIG. 8C3 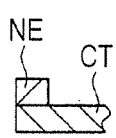

SEMICONDUCTOR DEVICE AND METHOD FOR MANUFACTURING THE SAME

CROSS-REFERENCE TO RELATED APPLICATIONS

The disclosure of Japanese Patent Application No. 2015-117796 filed on Jun. 10, 2015 including the specification, drawings and abstract is incorporated herein by reference in its entirety.

BACKGROUND

The present invention relates to a semiconductor device and a method for manufacturing the same, and can be utilized suitably for a semiconductor device including an IE type IGBT in particular.

For example, in Japanese Unexamined Patent Application Publication No. 2013-140885, an IE type trench gate IGBT is disclosed which includes a first linear unit cell region having a linear active cell region, a second linear unit cell region having a linear hole collector region, and a linear inactive cell region between them.

Also, in Japanese Unexamined Patent Application Publication No. 2013-258190, a narrow active cell IE type IGBT is disclosed which has an active cell two-dimensional thinned-out structure and does not have a substrate trench for contact.

SUMMARY

The present inventors have been engaged in research and development of a semiconductor device including such IE type IGBT as described above, and have been hardly studying on improvement of its property. Particularly, with respect to the configuration of the semiconductor device, it is desirable to improve the property of the device while comprehensively studying various factors such as the layout of respective portions and their working accuracy.

Other problems and new features will be clarified from the description of the present specification and the attached drawings.

Out of the embodiments disclosed in the present application, representative ones are summarized briefly as follows.

A semiconductor device shown in an embodiment disclosed in the present application includes a first trench that penetrates a p-type body region and reaches an n$^-$-type drift region, a second trench that is arranged to be apart from the first trench, a third trench that is arranged to be apart from the second trench, and an n$^+$-type emitter region that is arranged in the p-type body region and is arranged so as to come in contact with the first side surface of the first trench. Also, the semiconductor device includes a first gate electrode arranged in the inside of the first trench through a first insulating film, a second gate electrode arranged in the inside of the second trench through a second insulating film, a third gate electrode arranged in the inside of the second trench through a third insulating film, and a coupling section that couples the second gate electrode and the third gate electrode with each other. Further, the semiconductor device includes a fourth insulating film that is arranged in an inactive cell region which is a first region between the first trench and the second trench and a second region between the second trench and the third trench, a first opening that penetrates the fourth insulating film and comes in contact with the n$^+$-type emitter region, and a first electrode that is coupled with the n$^+$-type emitter region through the first opening. Also, the first region extends in the first direction, and the coupling section extends in the second section that crosses the first section. Further, the first opening is divided in the crossing region of the extending direction of the first region and the coupling section, and the first opening includes a first section arranged on one side of the crossing region and a second section arranged on the other side of the crossing region in the first region. Thus, the first opening is not arranged in the crossing region.

A method for manufacturing a semiconductor device shown in an embodiment disclosed in the present application includes the steps of forming a first trench that reaches the middle of a semiconductor substrate, a second trench arranged so as to be apart from the first trench, and a third trench arranged so as to be apart from the second trench, and forming a conductive film over a semiconductor substrate including the inside of the first trench, the second trench and the third trench through a gate insulating film. Also, the method for manufacturing a semiconductor device includes the steps of forming a p-type body region on the first main surface side of an inactive cell region that is a first region between the first trench and the second trench and a second region between the second trench and the third trench, and forming an n$^+$-type emitter region so as to come in contact with a first insulating film in the first trench in the p-type body region of the first region. Further, the method for manufacturing a semiconductor device includes the steps of forming an interlayer insulating film over the first region and the second region, forming a first opening that comes in contact with the n$^+$-type emitter region by etching the interlayer insulating film, and forming a first electrode by forming a conductive film over the interlayer insulating film including the inside of the first opening. Also, the first trench and the second trench are formed so as to extend in the first direction, and the coupling section is formed so as to extend in the second direction that crosses the first direction. Further, the first opening is formed so as to be divided in the crossing region of the extending direction of the first region and the coupling section, and so as to include a first section arranged on one side of the crossing region and a second section arranged on the other side of the crossing region in the first region. In other words, the first opening is not arranged in the crossing region.

According to the semiconductor device shown in a representative embodiment shown below disclosed in the present application, the property of the semiconductor device can be improved.

According to the method for manufacturing a semiconductor device shown in a representative embodiment shown below disclosed in the present application, a semiconductor device with excellent property can be manufactured.

BRIEF DESCRIPTION OF THE DRAWINGS

FIG. 8A is a circuit diagram for explaining the operation of a parasitic NPN-Bipolar transistor.

FIG. 8B is a cross-sectional view for explaining the operation of the parasitic NPN-Bipolar transistor.

FIGS. 8C1, 8C2, and 8C3 each are a plan view of the end of a contact trench where the parasitic NPN-Bipolar transistor can possibly be formed.

DETAILED DESCRIPTION

Figure 1:
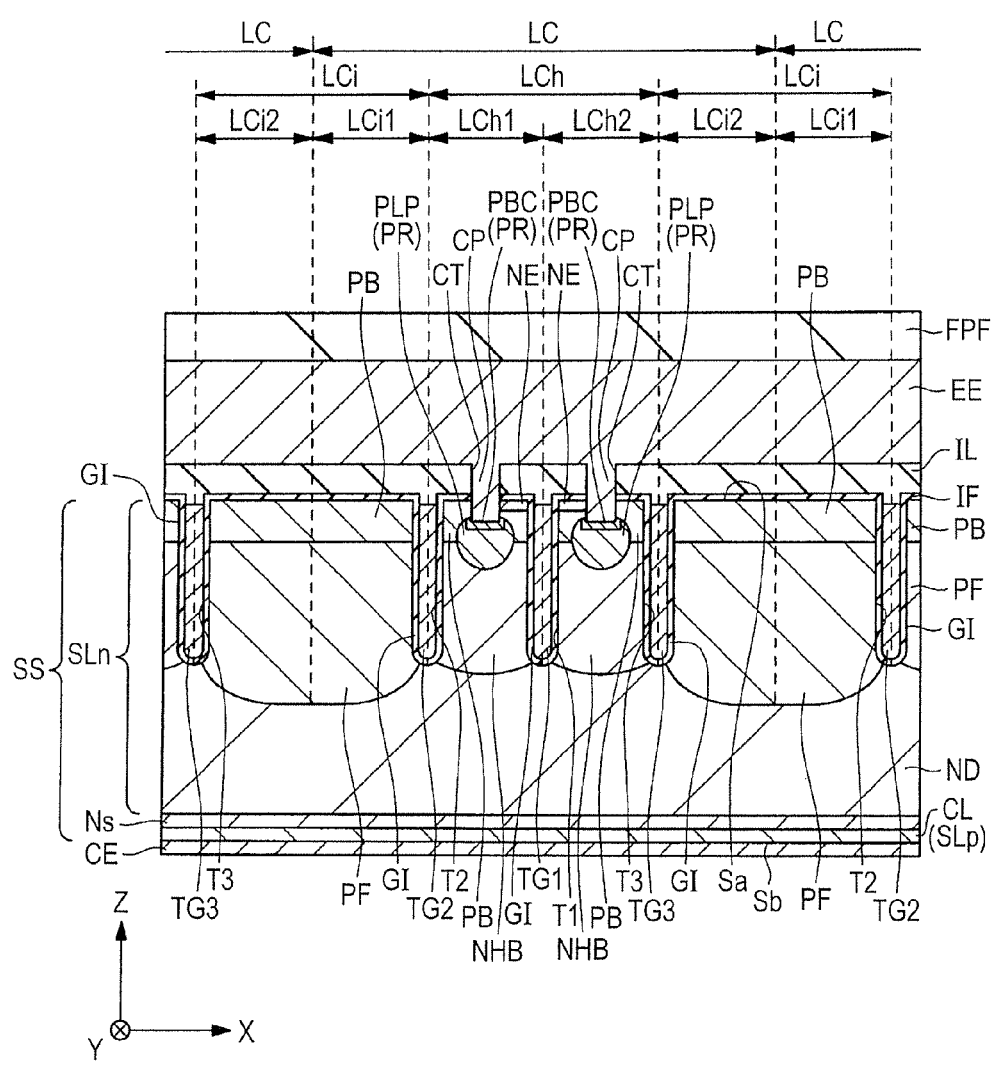
FIG. 1 is a cross-sectional view showing a configuration of a semiconductor device of the first embodiment.

In the embodiments below, when it is required for the sake of convenience, although description will be made dividedly into plural sections or embodiments, they are not unrelated to each other, and one has a relationship of a modification, application example, detailed explanation, supplementary explanation and the like of a part or entirety with the other with the exception of a case particularly stated explicitly. Further, in the embodiments below, when the quantity of elements and the like (including the number of pieces, numerical value, amount, range and the like) are mentioned, they are not limited to the specific quantity and may be equal to or more than and equal to or less than the specific quantity with the exception of a case particularly specified explicitly, a case apparently limited to a specific quantity in principle, and so on.

Further, in the embodiments below, the constituent elements thereof (also including the elemental step and the like) are not necessarily indispensable with the exception of a case particularly specified explicitly, a case considered to be apparently indispensable in principle, and so on. In a similar manner, in the embodiments below, when the shape, the positional relation and the like of a constituent element and the like are mentioned, they are to contain one that is substantially approximate or similar to the shape and the like thereof and so on with the exception of a case particularly specified explicitly, a case apparently considered not to be the case in principle, and so on. This fact also applies to the quantity and the like (including the number of pieces, numerical value, amount, range and the like) described above.

Below, the embodiment will be explained in detail based on the drawings. Also, in all drawings for explaining the embodiment, a same or related reference sign will be given to a member having a same function, and repeated explanation thereon will be omitted. Further, when there exist plural similar members (portions), there is a case a mark is added to the reference sign of the generic term to show an individual or specific portion. In addition, in the embodiments below, explanation on a same or similar portions will not be repeated in principle except when it is particularly required.

Also, in the drawings used in the embodiment, there is also a case hatching is omitted even in a cross-sectional view in order to facilitate understanding of the drawing. Further, there is also a case hatching is given even in a plan view in order to facilitate understanding of the drawing.

Further, in the cross-sectional view and plan view, there is a case the size of each portion does not correspond to that of the actual device and a specific portion is illustrated so as to be comparatively large in order to facilitate understanding of the drawing. Also, even when the cross-sectional view and the plan view correspond to each other, there is a case a specific portion is illustrated so as to be comparatively large in order to facilitate understanding of the drawing.

First Embodiment

Below, a semiconductor device of the present embodiment will be explained in detail referring to the drawings. The semiconductor device of the present embodiment is an IGBT (Insulated Gate Bipolar Transistor). In particular, because it exerts the IE (Injection Enhancement) effect with which discharging the hole (positive hole) to the emitter electrode side (surface side) is restricted when the IGBT is in the ON-state and concentration of the electric charge accumulated in the drift region can be increased, it is called an IE type. Also, the semiconductor device of the present embodiment is called an EGE type (Emitter-Gate-Emitter type) because a trench gate electrode (TG1) disposed in the center out of three trench gate electrodes arrayed so as to be apart from each other is electrically coupled with the gate electrode and each of two trench gate electrodes (TG2, TG3) disposed in both ends is electrically coupled with the emitter electrode.

[Explanation of Structure]

Figure 2:
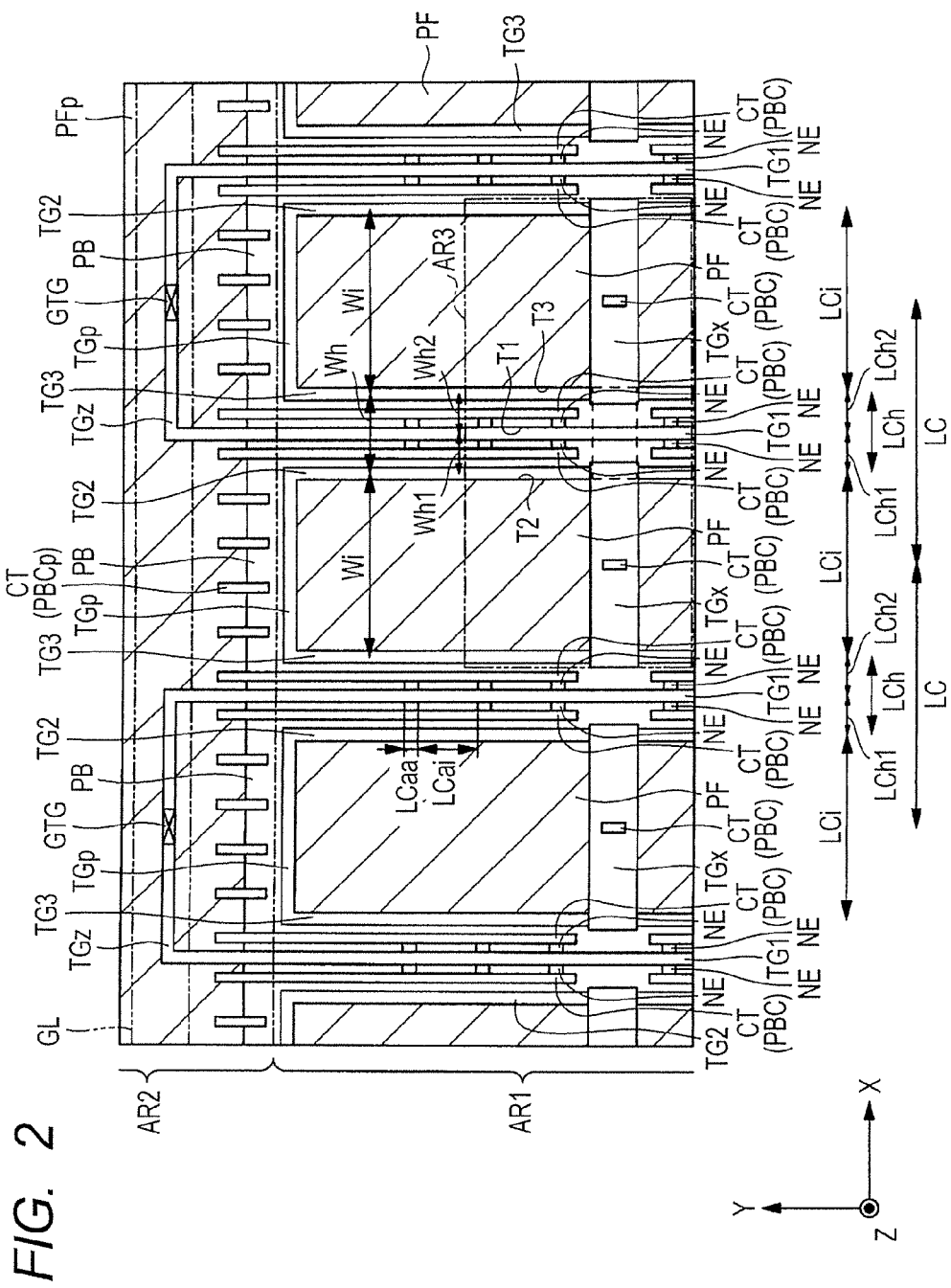
FIG. 2 is a plan view showing a configuration of the semiconductor device of the first embodiment.
Figure 3:
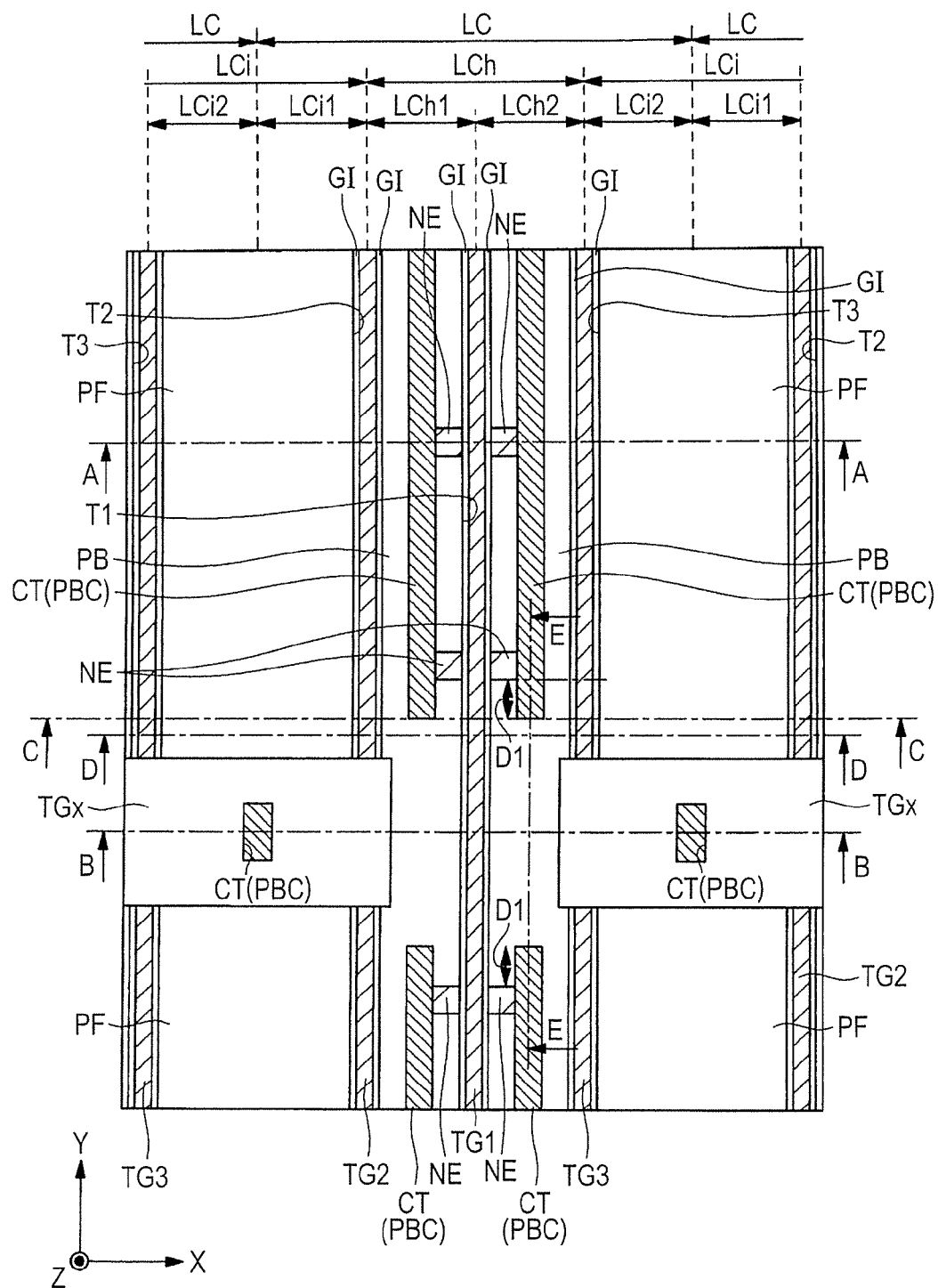
FIG. 3 is a plan view showing a configuration of the semiconductor device of the first embodiment.
Figure 4:
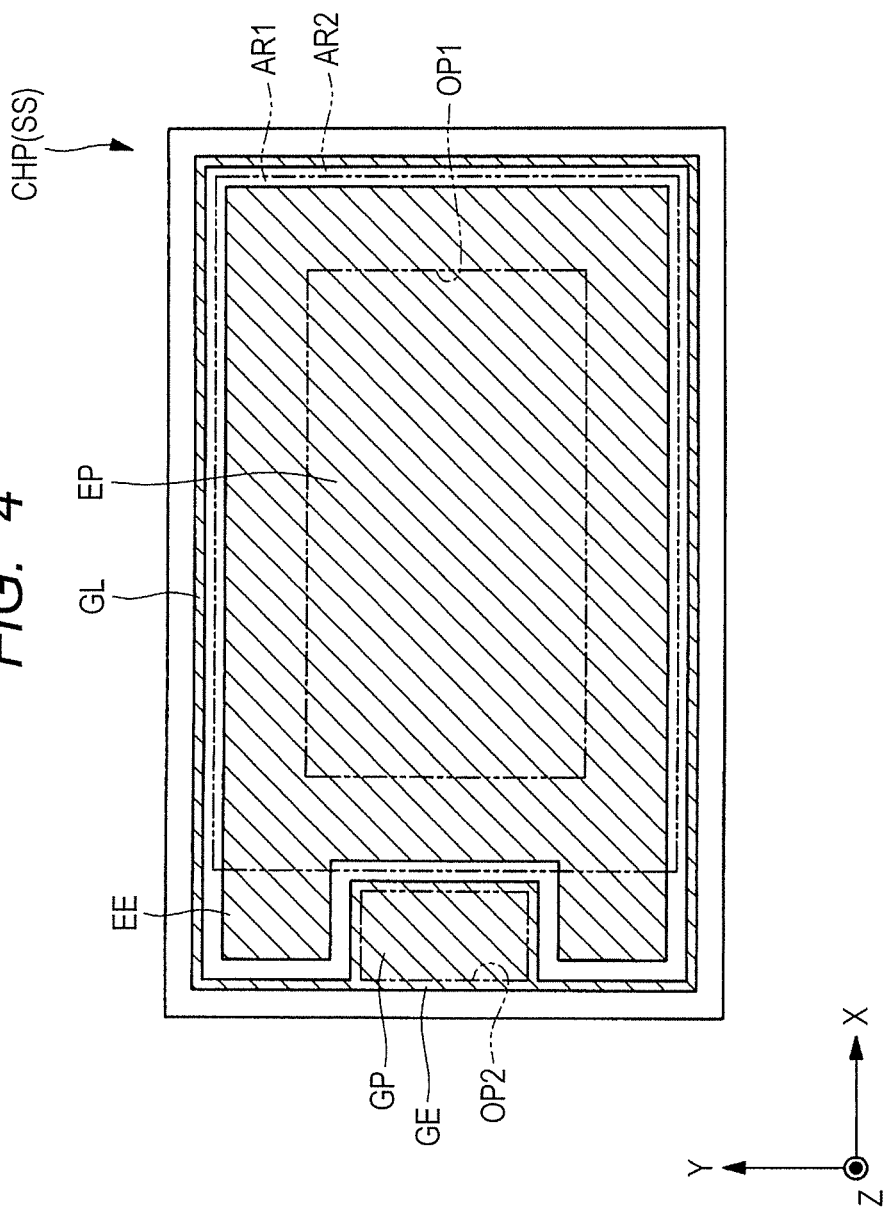
FIG. 4 is a plan view showing a configuration of the semiconductor device (semiconductor chip) of the first embodiment.

FIG. 1 is a cross-sectional view showing a configuration of a semiconductor device of the present embodiment, and FIG. 2 and FIG. 3 are plan views showing a configuration of the semiconductor device of the present embodiment. FIG. 1 corresponds to Section A-A of FIG. 3 for example. FIG. 3 corresponds to the region surrounded by the two-dot chain line in FIG. 2 for example. FIG. 4 is a plan view showing a configuration of the semiconductor device (semiconductor chip) of the present embodiment.

A configuration of the semiconductor device of the present embodiment will be explained referring to FIG. 1-FIG. 4.

A semiconductor substrate SS includes an upper surface (main surface) Sa and a lower surface (main surface) Sb on the opposite side of the upper surface Sa. The semiconductor substrate SS includes a semiconductor layer SLn of n-type on the upper surface Sa side, and a semiconductor layer SLp on the lower surface Sb side.

In the lower layer part of the semiconductor layer SLn, an $n^-$-type drift region (semiconductor region of n-type) ND is formed. Between the semiconductor layer SLn and the semiconductor layer SLp, an n-type field stop region (semiconductor region of n-type) Ns is formed. This semiconductor layer SLp corresponds to a $p^+$-type collector region (semiconductor region of p-type) CL. In the lower surface Sb of the semiconductor substrate SS (below the $p^+$-type collector region CL), a collector electrode CE is formed.

In the upper layer part of the semiconductor layer SLn, a p-type body region PB is arranged. In the center part of FIG. 1, on the upper surface Sa side of the semiconductor substrate SS, a trench (groove, groove part) T1 is formed. The trench T1 is formed so as to penetrate the p-type body region PB from the upper surface Sa and to reach the middle of the semiconductor layer SLn. Also, the trench T1 is formed so as to reach the $n^-$-type drift region ND. The shape viewed from the upper surface of this trench T1 (will be hereinafter referred to as a plan shape) is a rectangle (line shape) having the long side in Y direction. Thus, the trench T1 extends in Y direction (FIG. 2, FIG. 3).

On the inner wall of the trench T1, a gate insulating film GI is formed. In the inside of the trench T1, a trench gate electrode TG1 is formed over the gate insulating film GI so as to fill the trench T1 (FIG. 1). The trench gate electrode TG1 is electrically coupled with a gate electrode GE (refer to FIG. 4) described below. Also, the trench gate electrode TG1 is formed continuously along Y-direction in plan view (FIG. 2, FIG. 3).

On the other hand, on both sides of the trench T1, trenches T2 and T3 are formed so as to be apart by a predetermined distance (Wh1, Wh2).

Here, the space from the trench T2 to the trench T3 is a hybrid cell region LCh. Among the trenches, the space from the trench T2 to the trench T1 is made a hybrid sub-cell region LCh1, and the space from the trench T3 to the trench T1 is made a hybrid sub-cell region LCh2. Therefore, it can be said that the trench T1 is the center part of the hybrid cell region LCh and is positioned in the boundary part of the hybrid sub-cell region LCh1 and the hybrid sub-cell region LCh2. The width of the hybrid sub-cell region LCh1 in X direction is Wh1, and the width of the hybrid sub-cell region LCh2 in X direction is Wh2.

Also, on both sides of the hybrid cell region LCh, an inactive cell region LCi is positioned. To be more specific, the plural hybrid cell regions LCh are disposed as shown in FIG. 2, and the inactive cell regions LCi are disposed between the hybrid cell regions LCh. Also, these regions extend in Y direction.

Thus, because the hybrid cell regions LCh are disposed repeatedly through the inactive cell regions LCi, for example in FIG. 2, on the right side of the hybrid cell regions LCh, the trenches T2 are disposed so as to be apart by the width (Wi) of the inactive cell region LCi. Also, in FIG. 2, on the left side of the hybrid cell regions LCh, the trenches T3 are disposed so as to be apart by the width (Wi) of the inactive cell region LCi.

Further, here, a unit cell region LC is defined as a region that includes the hybrid cell regions LCh, a portion LCi1 of the inactive cell region LCi on one side (the left side in FIG. 1) of the hybrid cell region LCh, and a portion LCi2 of the inactive cell region LCi on the other side (the right side in FIG. 1). The portion LCi1 is a portion of a half of the inactive cell region LCi on the trench T2 side. The portion LCi2 is a portion of a half of the inactive cell region LCi on the trench T3 side. Therefore, it can be said also that, in FIG. 1, the unit cell regions LC are disposed repeatedly by plural numbers in X direction. Here, it is more preferable that the width Wh of the hybrid cell region LCh is made narrower than the width Wi of the inactive cell region LCi (FIG. 2). In other words, it is more preferable that the width of the hybrid sub-cell regions LCh1, LCh2 is made smaller than half the width Wi of the inactive cell region LCi. That is to say, it is more preferable that the width of the hybrid sub-cell regions LCh1, LCh2 is made smaller than the width of the portions LCi1, LCi2 of the inactive cell region LCi.

The trenches T2 and T3 respectively reach the middle of the semiconductor layer SLn from the upper surface Sa, are disposed on both sides of the trench T1, and respectively extend in Y direction in plan view.

Over the inner wall of each of the trenches T2 and T3, the gate insulating film GI is formed. In the inside of the trench T2, a trench gate electrode TG2 is formed over the gate insulating film GI so as to fill the trench T2. In the inside of the trench T3, a trench gate electrode TG3 is formed over the gate insulating film GI so as to fill the trench T3. The trench gate electrodes TG2 and TG3 are electrically coupled with an emitter electrode EE. Also, each of the trench gate electrodes TG2 and TG3 are formed continuously along Y-direction in plan view.

In the hybrid sub-cell region LCh1, the p-type body region PB is formed between the trench T1 and the trench T2, and comes in contact with the gate insulating film GI formed over the inner wall of the trench T1 and the gate insulating film GI formed over the inner wall of the trench T2. Also, in the hybrid sub-cell region LCh2, the p-type body region PB is formed between the trench T1 and the trench T3, and comes in contact with the gate insulating film GI formed over the inner wall of the trench T1 and the gate insulating film GI formed over the inner wall of the trench T3.

Further, in each of the hybrid sub-cell regions LCh1 and LCh2, on the upper surface Sa side of the semiconductor substrate SS, an $n^+$-type emitter region NE is formed only on the trench gate electrode TG1 side. That is to say, in the hybrid sub-cell region LCh1, the $n^+$-type emitter region NE is not formed on the trench gate electrode TG2 side, and, in the hybrid sub-cell region LCh2, the $n^+$-type emitter region NE is not formed on the trench gate electrode TG3 side (FIG. 1).

Also, as shown in FIG. 2 and FIG. 3, the $n^+$-type emitter region NE is disposed by plural numbers at a predetermined distance (LCai) in Y direction. Therefore, in each of the hybrid sub-cell regions LCh1 and LCh2, there also exists a region (cross section) where the $n^+$-type emitter region NE is not formed.

Also, in the hybrid sub-cell region LCh1, the $n^+$-type emitter region NE is formed between the trench T1 and a contact trench CT, and comes in contact with the p-type body region PB and the gate insulating film GI formed over the inner wall of the trench T1 (the side surface of the trench T1). Further, in the hybrid sub-cell region LCh2, the $n^+$-type emitter region NE is formed between the trench T1 and the contact trench CT, and comes in contact with the p-type body region PB and the gate insulating film GI formed over the inner wall of the trench T1. The plan shape of this $n^+$-type emitter region NE is a rectangular shape for example, the width in Y direction is LCaa, and the width in X direction corresponds to the distance between the contact trench CT and the trench T1 (FIG. 3).

Also, the $n^+$-type emitter region NE of the hybrid sub-cell region LCh1 is electrically coupled with the emitter electrode EE, and the $n^+$-type emitter region NE of the hybrid sub-cell region LCh2 is electrically coupled with the emitter electrode EE.

In each of the hybrid sub-cell regions LCh1 and LCh2, it is preferable that an n-type hole barrier region (a semiconductor region of n-type) NHB is formed under the p-type body region PB. In each of the hybrid sub-cell regions LCh1 and LCh2, the concentration of the n-type impurities of the n-type hole barrier region NHB is higher than the concentration of the n-type impurities of the $n^-$-type drift region ND, and is lower than the concentration of the n-type impurities of the $n^+$-type emitter region NE.

The n-type hole barrier region NHB of the hybrid sub-cell region LCh1 is formed between the trench T1 and the trench T2, and the n-type hole barrier region NHB of the hybrid sub-cell region LCh2 is formed between the trench T1 and the trench T3.

Also, the n-type hole barrier region NHB of the hybrid sub-cell region LCh1 may come in contact with the p-type body region PB, the gate insulating film GI formed over the inner wall of the trench T1, and the gate insulating film GI formed over the inner wall of the trench T2. Further, the n-type hole barrier region NHB of the hybrid sub-cell region LCh2 may come in contact with the p-type body region PB, the gate insulating film GI formed over the inner wall of the trench T1, and the gate insulating film GI formed over the inner wall of the trench T3. Thus, because the holes accumulated within the $n^-$-type drift region ND are hardly discharged to the emitter electrode EE in the hybrid sub-cell regions LCh1 and LCh2, the IE effect can be improved.

In the inactive cell region LCi on the trench T2 side (the left side in FIGS. 1-3) of the hybrid cell region LCh, on the upper surface Sa side of the semiconductor substrate SS, a p-type floating region (the semiconductor region of p-type) PF is arranged below the p-type body region PB. This p-type floating region PF is arranged between the trench T2 described above and the trench T3 in the left end in the drawing. Also, in the inside of the trench T3 in the left end in the drawing, the trench gate electrode TG3 is formed over the gate insulating film GI so as to fill the trench T3. Each of these trench gate electrodes TG3 is formed continuously along Y direction in plan view.

In the inactive cell region LCi on the trench T3 side (the right side in FIGS. 1-3) of the hybrid cell region LCh, on the upper surface Sa side of the semiconductor substrate SS, the p-type floating region (the semiconductor region of p-type) PF is arranged below the p-type body region PB. This p-type floating region PF is arranged between the trench T3 described above and the trench T2 in the right end in the drawing. Also, in the inside of the trench T2 in the right end in the drawing, the trench gate electrode TG2 is formed over the gate insulating film GI so as to fill the trench T2. This trench gate electrode TG2 is formed continuously along Y direction in plan view.

Also, the trench gate electrodes TG2 and TG3 extending in Y-direction in both sides of the inactive cell region LCi are electrically coupled with each other by an end trench gate electrode TGp that extends in X direction.

Further, the trench gate electrodes TG2 and TG3 on both sides of the inactive cell region LCi are electrically coupled with each other by an emitter coupling section TGx that extends in X direction. The emitter coupling section TGx is formed of a material same as that of the trench gate electrodes TG2 and TG3 for example. Also, the emitter coupling section TGx is electrically coupled with the emitter electrode EE through the contact trench CT that is formed in the emitter coupling section TGx (refer to FIG. 2, FIG. 3, and FIG. 5). With such structure, reliability of electrical coupling between the trench gate electrodes TG2 and TG3 and the emitter electrode EE can be improved without depending on a fine working process that is of an unnecessarily high cost.

Also, in the hybrid cell region LCh and the inactive cell region LCi, over the upper surface Sa of the semiconductor substrate SS, an interlayer insulating film IL is formed (FIG. 1). The interlayer insulating film IL is formed so as to cover the p-type body region PB in each of the hybrid sub-cell regions LCh1 and LCh2. Also, between the upper surface Sa of the semiconductor substrate SS and the interlayer insulating film IL, an insulating film IF may be formed.

In this interlayer insulating film IL, the contact trench (opening) CT is formed. The contact trench (opening) CT is formed so as to come in contact with the $n^+$-type emitter region NE.

Over the bottom surface of this contact trench CT, a $p^+$-type body contact region (a semiconductor region of p-type) PBC is formed. Also, under the $p^+$-type body contact region PBC, a $p^+$-type latch-up preventing region (a semiconductor region of p-type) PLP is formed. A $p^+$-type semiconductor region PR is formed by the $p^+$-type body contact region PBC and the $p^+$-type latch-up preventing region PLP.

The concentration of the p-type impurities of this $p^+$-type body contact region PBC is higher than the concentration of the p-type impurities of the $p^+$-type latch-up preventing region PLP. Also, the concentration of the p-type impurities of the $p^+$-type semiconductor region PR is higher than the concentration of the p-type impurities of the p-type body region PB.

In the inside of the contact trench CT, a coupling electrode CP is formed. This coupling electrode CP comes in contact with the $n^+$-type emitter region NE and the $p^+$-type semiconductor region PR.

Figure 5:
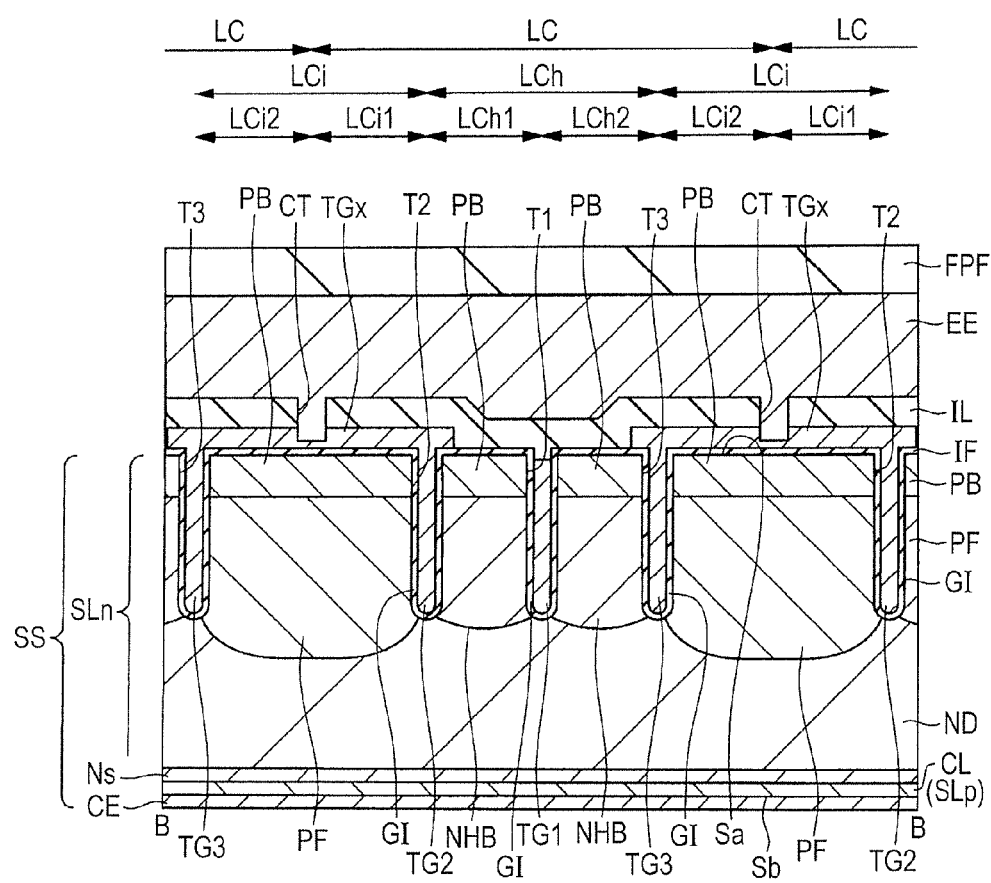
FIG. 5 is a cross-sectional view showing a configuration of the semiconductor device of the first embodiment.

Also, the contact trench (opening) CT is also formed over the emitter coupling section TGx (refer to FIG. 2, FIG. 3 and FIG. 5).

Further, over the interlayer insulating film IL, the emitter electrode EE formed of a conductive film is arranged, and the emitter electrode EE is coupled with the $n^+$-type emitter region NE and the $p^+$-type body contact region PBC through the contact trench CT. In the example shown in FIG. 1, the coupling electrode CP and the emitter electrode EE are formed integrally. Also, as described above, the emitter electrode EE is coupled with the emitter coupling section TGx through the contact trench CT. Therefore, the trench gate electrodes TG2 and TG3 come to be electrically coupled with the emitter electrode EE through the emitter coupling section TGx as described above.

Over the emitter electrode EE, an insulating film (passivation film) FPF formed of a polyimide-system organic insulating film and the like for example is further formed.

Also, as shown in FIG. 2, a p-type floating region PFp is arranged in a gate wiring draw-out region AR2 so as to surround a cell forming region AR1. In FIG. 2, the p-type floating regions PFp, PF are hatched regions. Also, this p-type floating region PFp is electrically coupled with the emitter electrode EE through a $p^+$-type body contact region PBCp which is a portion exposed in the bottom surface of the contact trench CT.

Here, in the present embodiment, although the contact trench CT that comes in contact with the $n^+$-type emitter region NE extends in Y direction, it is not formed continuously as the trench gate electrode TG1 for example (FIG. 2, FIG. 3). That is to say, the contact trench CT that comes in contact with the $n^+$-type emitter region NE is disposed dividedly. In other words, the contact trench CT that comes in contact with the $n^+$-type emitter region NE includes the first section that is disposed on one side (the upper side in FIG. 2, FIG. 3) of the emitter coupling section TGx, and the second section that is disposed on the other side (the lower side in FIG. 2, FIG. 3) of the emitter coupling section TGx. Also, in other words, the contact trench CT that comes in contact with the $n^+$-type emitter region NE is disposed so as to avoid the crossing region of the extending regions of the hybrid cell region LCh and the emitter coupling section TGx. That is to say, the contact trench CT that comes in contact with the $n^+$-type emitter region NE is not disposed in the crossing region of the extending regions of the hybrid cell region LCh and the emitter coupling section TGx (FIG. 5). FIG. 5 is a cross-sectional view showing a configuration of the semiconductor device of the present embodiment. FIG. 5 corresponds to the cross section B-B of FIG. 3 for example. Also, the crossing region of the extending regions of the hybrid cell region LCh and the emitter coupling section TGx corresponds to the area surrounded by the chain line in FIG. 2 for example.

Thus, by disposing the contact trench CT that comes in contact with the $n^+$-type emitter region NE dividedly so as to avoid the crossing region of the extending regions of the hybrid cell region LCh and the emitter coupling section TGx, the working failure attributable to the unevenness caused by the emitter coupling section TGx can be avoided.

Figure 6:
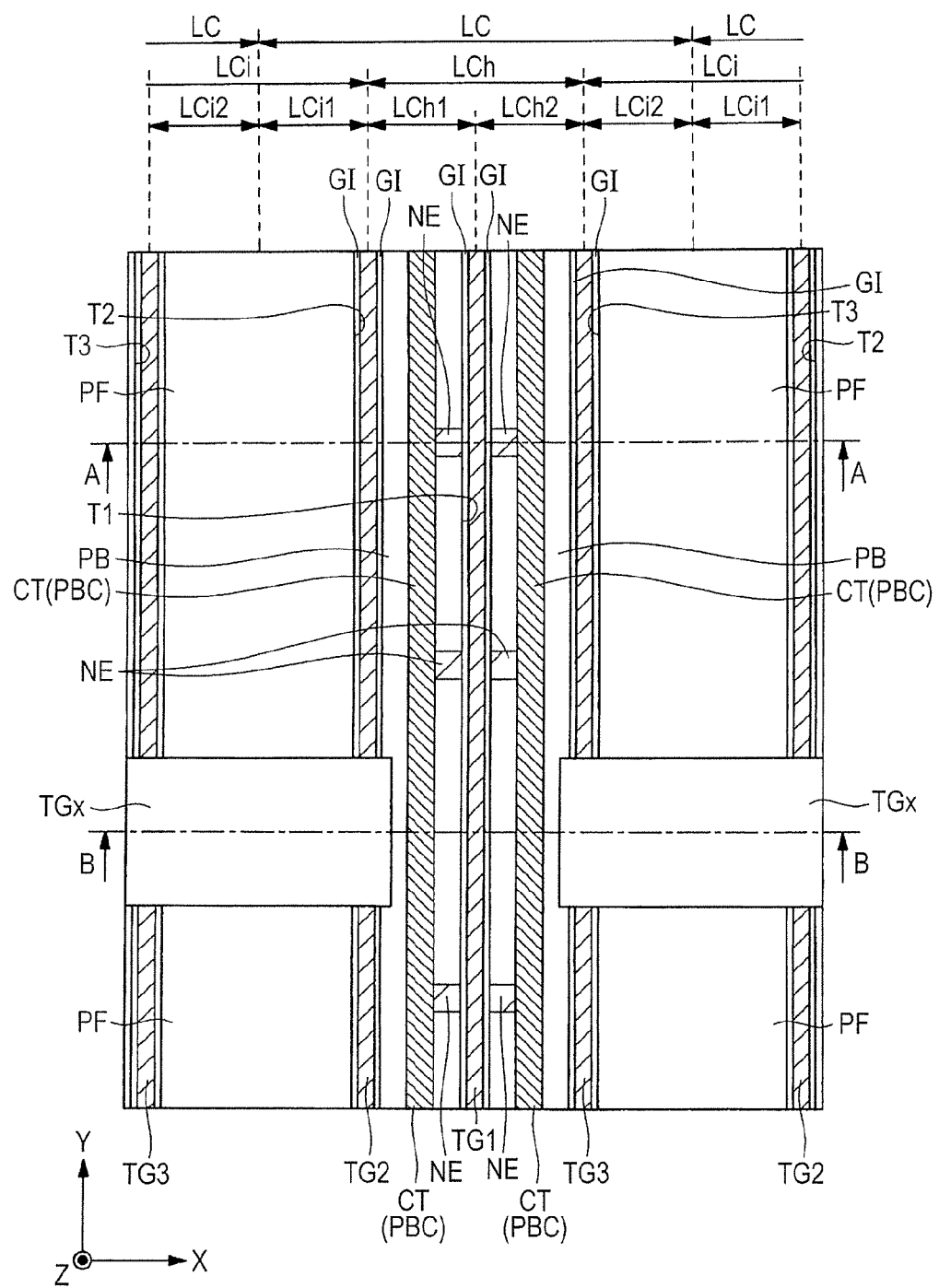
FIG. 6 is a plan view showing a configuration of the semiconductor device of a comparative example of the first embodiment.
Figure 7:
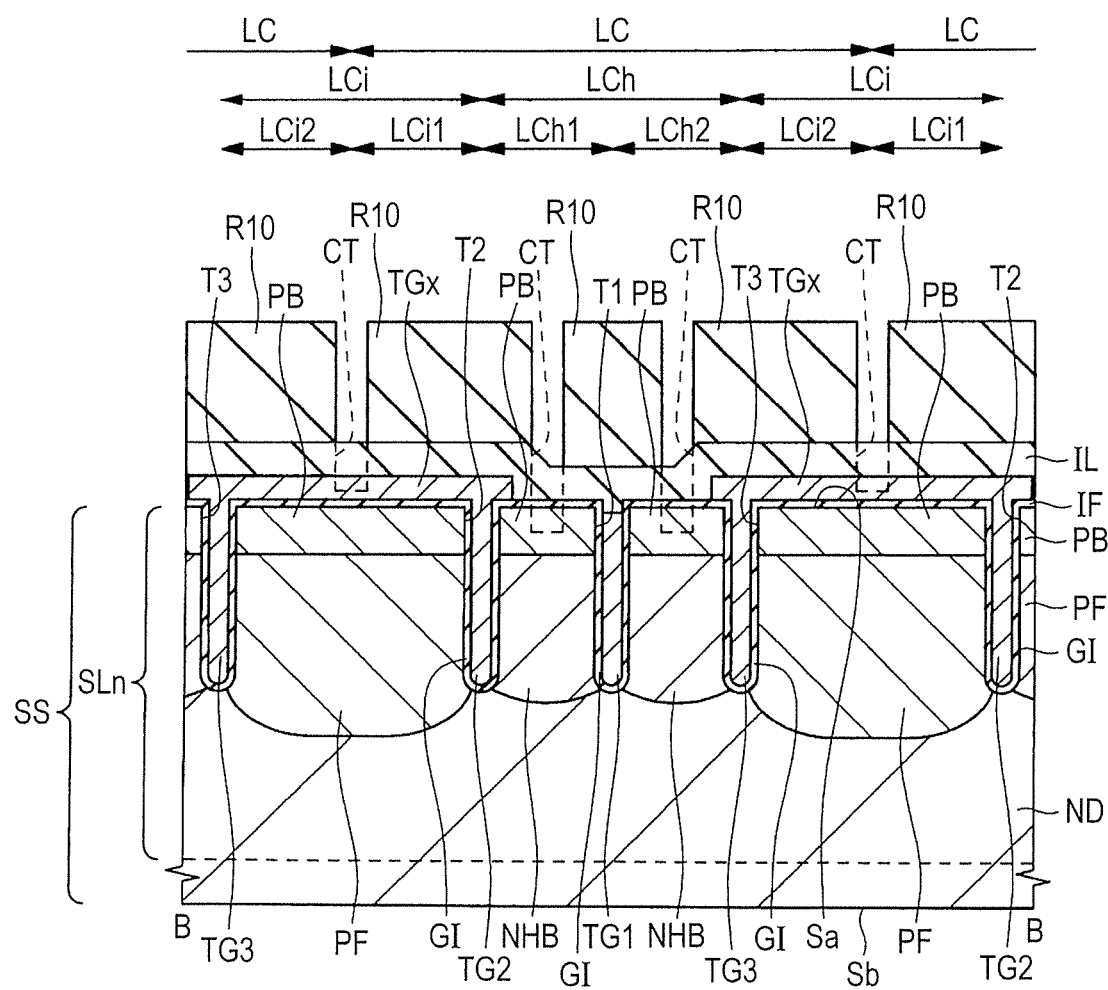
FIG. 7 is a cross-sectional view during a manufacturing step of a semiconductor device of a comparative example of the first embodiment.

FIG. 6 is a plan view showing a configuration of the semiconductor device of a comparative example of the present embodiment, and FIG. 7 is a cross-sectional view during a manufacturing step of the semiconductor device of a comparative example of the present embodiment. FIG. 7 corresponds to the cross section B-B of FIG. 6 for example. Also, the cross section A-A of FIG. 6 is similar to FIG. 1.

As shown in FIG. 7, in the crossing region of the extending regions of the hybrid cell region LCh and the emitter coupling section TGx, the unevenness (step) caused by the emitter coupling section TGx is generated. Therefore, when the contact trench CT that comes in contact with the $n^+$-type emitter region NE is to be disposed in the crossing region of the extending regions of the hybrid cell region LCh and the emitter coupling section TGx as shown in FIG. 7, it is necessary to form the contact trench CT over the unevenness (step).

In such case, the irregular reflection of the light in the unevenness (step) possibly occurs at the time of photolithography of a resist film (photoresist film) R10. By such irregular reflection of the light (also referred to as halation), there is a risk that the exposure pattern of a desired shape of the resist film R10 cannot be obtained and the shape of the exposure pattern becomes abnormal. Also, when the exposure pattern of an abnormal shape is developed and is made as a mask in forming the contact trench CT, the working failure of the contact trench CT occurs.

In this regard, according to the present embodiment, as described above, by disposing the contact trench CT that comes in contact with the n$^+$-type emitter region NE dividedly so as to avoid the crossing region of the extending regions of the hybrid cell region LCh and the emitter coupling section TGx, the working failure attributable to the unevenness caused by the emitter coupling section TGx can be avoided.

However, when such configuration is employed, there is a risk that large local current may flow by operation of the parasitic NPN-Bipolar transistor. In order to eliminate the concern of such operation of the parasitic NPN-Bipolar transistor, it is preferable to dispose the n$^+$-type emitter region NE so as to be apart from the end of the contact trench CT. In the present embodiment, the n$^+$-type emitter region NE is disposed so as to be apart by the distance D1 from the end of the contact trench CT as shown in FIG. 3. In other words, the n$^+$-type emitter region NE is disposed so as not to include the end of the contact trench CT.

By separating the n$^+$-type emitter region NE and the end of the contact trench CT from each other thus, the operation of the parasitic NPN-Bipolar transistor can be suppressed and the property of the semiconductor can be improved.

When the contact trench CT that comes in contact with the n$^+$-type emitter region NE is not formed in the crossing region of the extending regions of the hybrid cell region LCh and the emitter coupling section TGx, the discharge route for the holes from the rear surface comes to be blocked. Therefore, the hole is discharged to the emitter side of the front surface through a high pinch resistance. At this time, when the n$^+$-type emitter region NE is disposed in the discharge route of the hole, it is possible that a voltage drop of rbb'×hole current (Ih) portion is generated between the emitter bases of the parasitic NPN-Bipolar transistor and that the parasitic NPN-Bipolar transistor is shifted to the ON-state.

Explanation will be made more concretely. FIG. 8A is a circuit diagram for explaining the operation of a parasitic NPN-Bipolar transistor, and FIG. 8B is a cross-sectional view for explaining the operation of the parasitic NPN-Bipolar transistor. FIGS. 8C1, 8C2, and 8C3 each are a plan view of the end of a contact trench CT where the parasitic NPN-Bipolar transistor can possibly be formed. FIG. 8B corresponds to the cross section E-E of FIG. 3 for example. Also, in FIG. 8B, the layers higher than the interlayer insulating film IL are omitted.

The parasitic NPN-Bipolar transistor (NPN-Bip) shown in FIG. 8A makes a projection (channel section CH) of the p-type body region PB a base. The emitter side of the parasitic NPN-Bipolar transistor is coupled with the emitter electrode EE, and the collector side of the parasitic NPN-Bipolar transistor is coupled with the collector electrode CE through a diode. Between the emitter electrode EE and the collector electrode CE, a contact resistor Rc and a pn depletion layer capacitor Cpn are coupled in series. The resistance between these coupling nodes and the parasitic NPN-Bipolar transistor becomes rbb'.

As shown in FIG. 8B, the end of the contact trench CT (the region surrounded by the dotted line) is a region to which the hole current Ih having going through comparatively high resistance rbb' is concentrated. In this region, when the n$^+$-type emitter region NE is disposed in the paper surface back direction, the n$^+$-type emitter region NE comes to be disposed in the discharge route of the holes, and the parasitic NPN-Bipolar transistor is formed. In other words, when the n$^+$-type emitter region NE is disposed so as to come in contact with the end of the contact trench CT as shown in FIGS. 8C1, 8C2, and 8C3, the parasitic NPN-Bipolar transistor is formed, and the parasitic NPN-Bipolar transistor possibly becomes the ON-state.

For example, when the hole current Ih shown in FIG. 8A and FIGS. 8C1, 8C2, and 8C3 is large and the resistance rbb' is large, from the relation of emitter-base voltage VBE=Ih×rbb', the emitter-base voltage VBE becomes large. Also, when this emitter-base voltage VBE exceeds approximately 0.7 V, the gap between the emitter bases is forward-biased, and the parasitic NPN-Bipolar transistor is turned on. Thus, in the unit cell region LC where the parasitic NPN-Bipolar transistor operation has occurred, a large current uncontrollable by the gate bias of the MOSFET comes to flow in a state a drain voltage is applied. Also, when heat generation occurs by a large current, such positive feedback occurs that the electric resistance reduces by temperature rise and a larger current flows. As a result, there is a risk that a large current flows locally and the semiconductor device is eventually broken.

On the other hand, in the present embodiment, as shown in FIG. 3, because the n$^+$-type emitter region NE is disposed so as to be apart from the end of the contact trench CT by the distance D1, formation of the parasitic NPN-Bipolar transistor described above can be avoided. Therefore, the on-operation of the parasitic NPN-Bipolar transistor described above can be suppressed, and the breakdown resistance of the semiconductor device can be improved.

Also, it is preferable that the distance D1 between the n$^+$-type emitter region NE and the end of the contact trench CT is made 1 μm or more. By making the distance D1 1 μm or more, the distance between PN where the parasitic NPN-Bipolar transistor is configured can be made large, and the possibility of formation of the parasitic NPN-Bipolar transistor and operation thereof can be reduced further.

Also, it is preferable that, out of the contact trench CT, the first section that is disposed on one side (the upper side in FIG. 2, FIG. 3) of the emitter coupling section TGx and the second section that is disposed on the other side (the lower side in FIG. 2, FIG. 3) of the emitter coupling section TGx are disposed symmetrically (symmetrically vertically in FIG. 2, FIG. 3) with respect to the emitter coupling section TGx. Further, it is preferable that the n$^+$-type emitter regions NE are disposed respectively so as to be apart from respective ends by the same distance D1.

In addition, as described above, the n$^+$-type emitter region NE whose width in Y direction is LCaa is disposed by plural numbers at a predetermined distance (LCai) in Y direction. At this time, it can be designed so that the ratio of the disposal region and the non-disposal region is made a predetermined ratio (1:a). For example, with respect to this ratio, the n$^+$-type emitter regions NE can be disposed at a predetermined distance (LCai) so as to become symmetric with each other on one side (the upper side in FIG. 2, FIG. 3) of the emitter coupling section TGx and the other side (the lower side in FIG. 2, FIG. 3) while securing the distance D1 between the n$^+$-type emitter region NE and the end of the contact trench CT. Also, the n$^+$-type emitter region NE may be arranged in a line shape on one side (the upper side in FIG. 2, FIG. 3) of the emitter coupling section TGx and the other side (the lower side in FIG. 2, FIG. 3) while achieving a=0 namely securing the distance D1 between the n$^+$-type emitter region NE and the end of the contact trench CT.

[Explanation of Manufacturing Method]

Next, a manufacturing step of the semiconductor device of the present embodiment will be explained, and the structure of the semiconductor device of the present embodiment will be made clearer.

FIG. 9-FIG. 32 are cross-sectional views showing a manufacturing step of the semiconductor device of the present embodiment.

Figure 9:
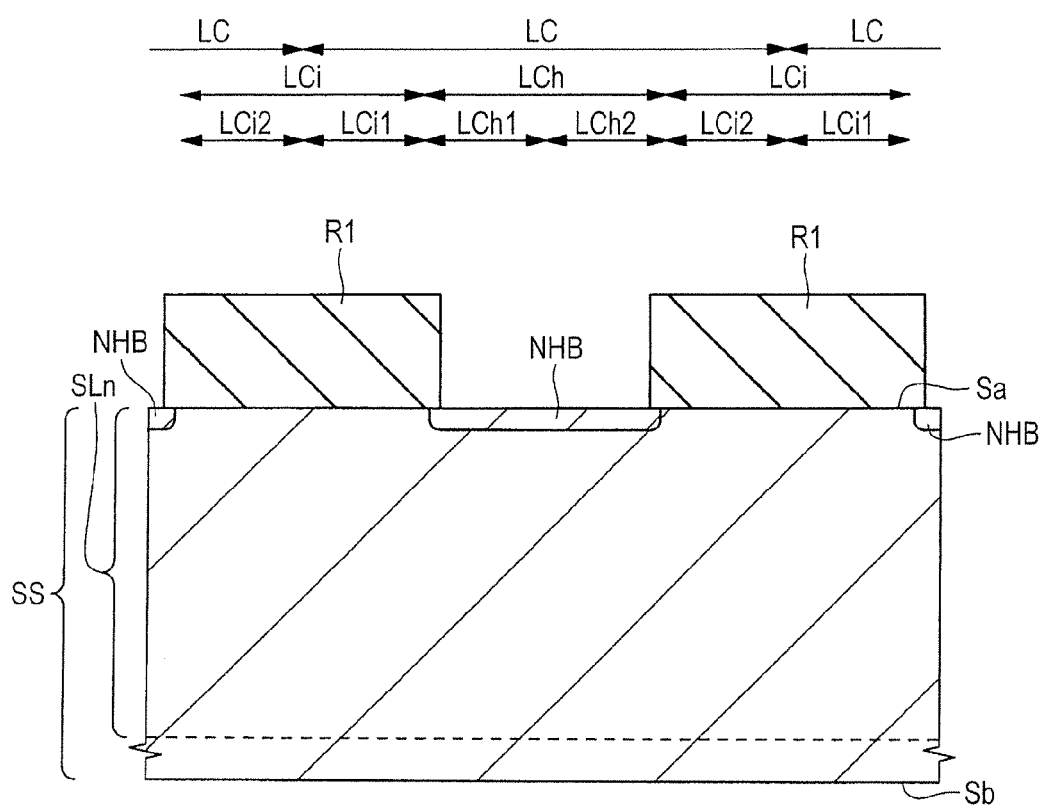
FIG. 9 is a cross-sectional view showing a manufacturing step of the semiconductor device of the first embodiment.

First, as shown in FIG. 9, the semiconductor substrate SS formed of silicon mono-crystal to which n-type impurities such as phosphor (P) for example is introduced is provided. The semiconductor substrate SS includes the upper surface Sa as the first main surface and the lower surface Sb as the second surface on the opposite side of the upper surface Sa.

The semiconductor substrate SS contains n-type impurities. The concentration of the impurities is approximately $2 \times 10^{14}$ cm$^{-3}$ for example. At this stage, the semiconductor substrate SS is a thin sheet of a semiconductor of a flat and generally circular shape which is called a wafer. The thickness of the semiconductor substrate SS is approximately 450 µm-1,000 µm for example. The layer of this semiconductor substrate SS from the upper surface Sa to a predetermined depth becomes the semiconductor layer SLn.

Next, in the entire surface over the upper surface Sa of the semiconductor substrate SS, a resist film (photoresist film) R1 for introducing an n-type hole barrier region is formed by coating and the like and is patterned by ordinary photolithography (exposure and development), and the resist film R1 having openings in the hybrid cell region LCh is formed. By introducing the n-type impurities to the upper surface Sa of the semiconductor substrate SS by ion injection for example using this resist film R1 as a mask, the n-type hole barrier region NHB is formed. As the ion injection condition of this time, an ion injection condition in which the ion kind is made phosphor (P), the dose amount is made approximately $6 \times 10^{12}$ cm$^{-2}$, and the injection energy is made approximately 80 KeV for example can be exemplified as a preferable one. Thereafter, the resist film R1 that has become unnecessary is removed by ashing and the like.

Figure 10:
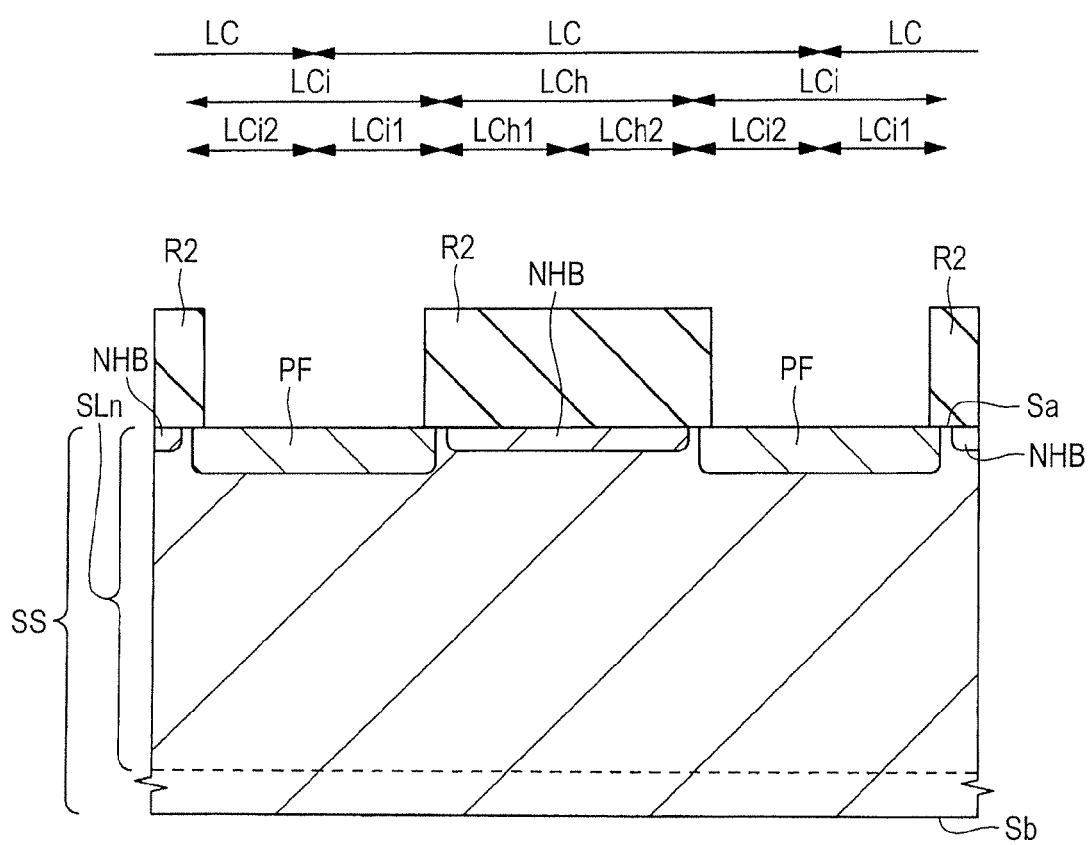
FIG. 10 is a cross-sectional view showing a manufacturing step of the semiconductor device of the first embodiment, and is a cross-sectional view showing a manufacturing step of the semiconductor device following FIG. 9.

Next, as shown in FIG. 10, over the upper surface Sa of the semiconductor substrate SS, a resist film R2 for introducing a p-type floating region is formed by coating and the like and is patterned by ordinary photolithography, and the resist film R2 having openings in the inactive cell region LCi is formed. By introducing the p-type impurities to the upper surface Sa of the semiconductor substrate SS by ion injection for example using this resist film R2 as a mask, the p-type floating region PF is formed. As the ion injection condition of this time, an ion injection condition in which the ion kind is made boron (B), the dose amount is made approximately $3.5 \times 10^{13}$ cm$^{-2}$, and the injection energy is made approximately 75 KeV for example can be exemplified as a preferable one. Thereafter, the resist film R2 that has become unnecessary is removed by ashing and the like. Also, when the p-type floating region PF is formed in the cell forming region AR1 (refer to FIG. 2), the p-type floating region PFp is formed in the outermost part of the gate wiring draw-out region AR2 (refer to FIG. 2) for example.

Figure 11:
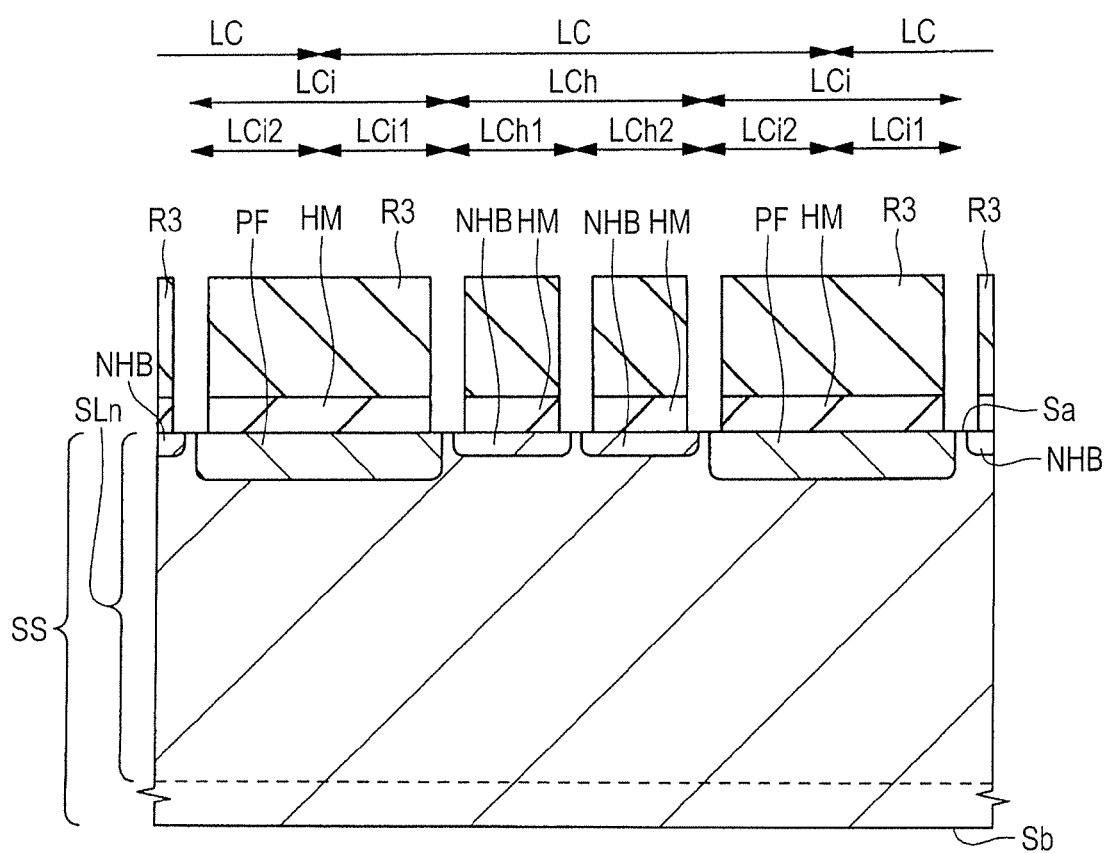
FIG. 11 is a cross-sectional view showing a manufacturing step of the semiconductor device of the first embodiment, and is a cross-sectional view showing a manufacturing step of the semiconductor device following FIG. 10.

Next, as shown in FIG. 11, over the upper surface Sa of the semiconductor substrate SS, a hard mask film HM formed of silicon oxide for example is formed by a CVD (Chemical Vapor Deposition) method and the like for example. The thickness of the hard mask film HM is approximately 450 nm for example.

Next, over the upper surface Sa of the semiconductor substrate SS, a resist film R3 for working the hard mask film is formed by coating and the like and is patterned by ordinary photolithography, and the resist film R3 having openings in the trench (T1-T3) forming region is formed. The hard mask film HM is patterned by dry etching for example using this resist film R3 as a mask.

Figure 12:
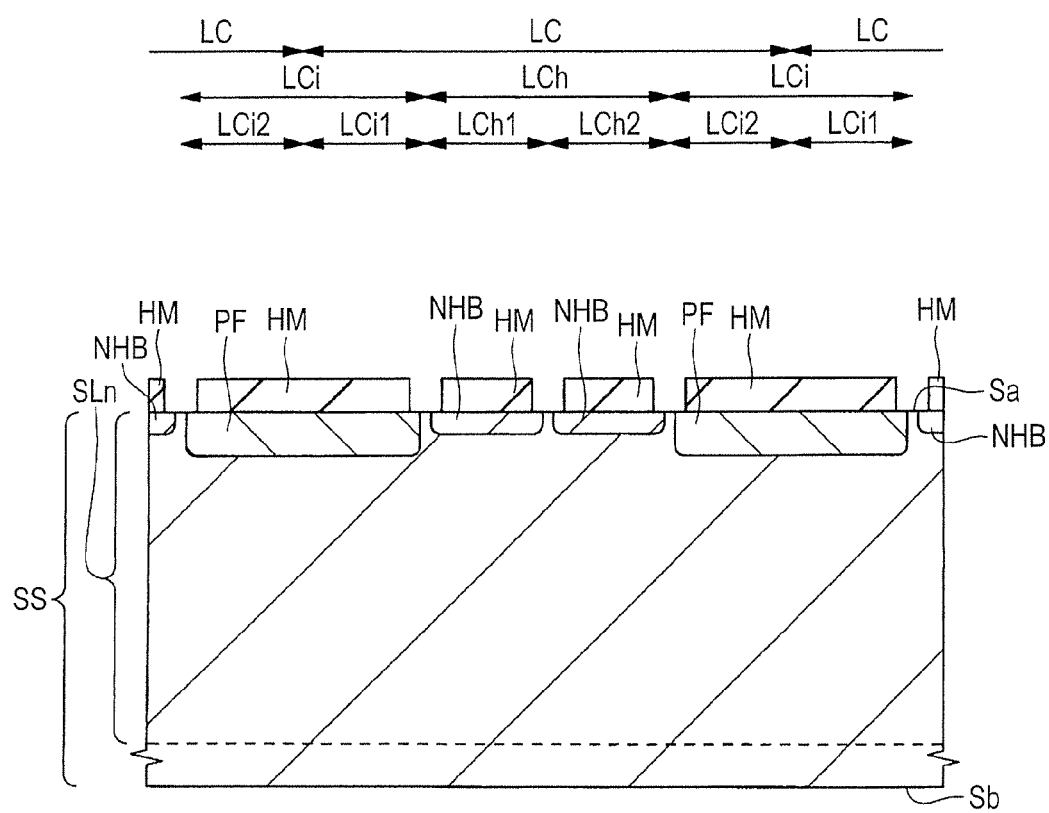
FIG. 12 is a cross-sectional view showing a manufacturing step of the semiconductor device of the first embodiment, and is a cross-sectional view showing a manufacturing step of the semiconductor device following FIG. 11.
Figure 13:
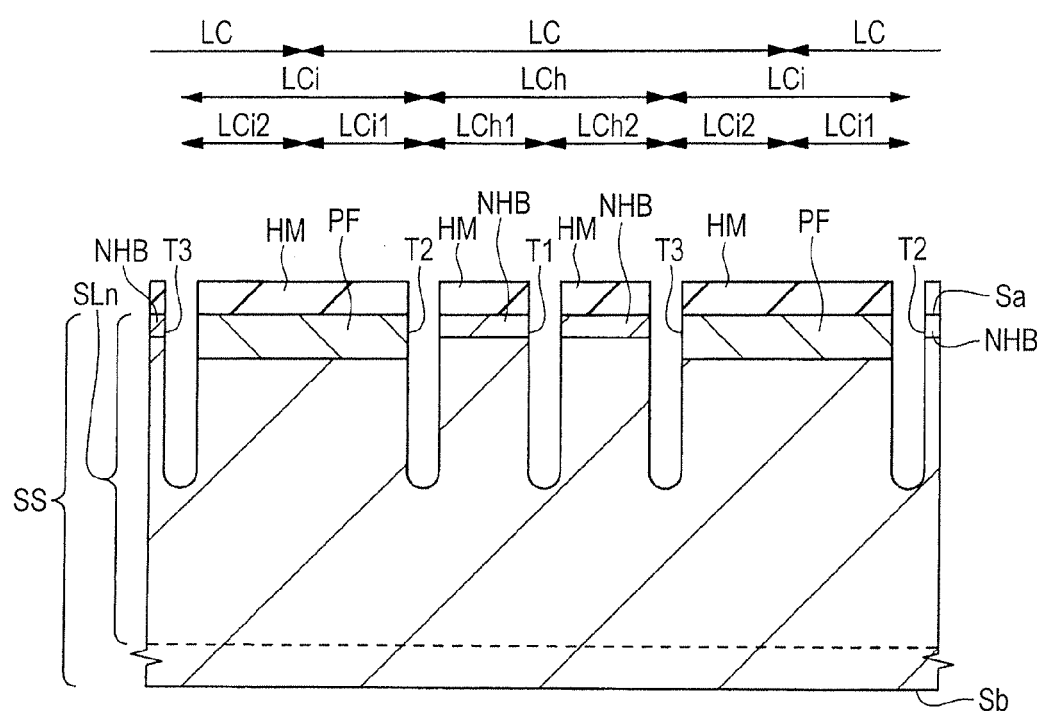
FIG. 13 is a cross-sectional view showing a manufacturing step of the semiconductor device of the first embodiment, and is a cross-sectional view showing a manufacturing step of the semiconductor device following FIG. 12.

Thereafter, as shown in FIG. 12, the resist film R3 that has become unnecessary is removed by asking and the like, and the trenches T1, T2, and T3 are formed by anisotropic dry etching for example using the remaining hard mask film HM (FIG. 13). At this time, the trench T1 is formed which reaches the middle of the semiconductor layer SLn from the upper surface Sa of the semiconductor substrate SS and extends in Y direction in plan view. Also, the trenches T2 and T3 are formed which respectively reach the middle of the semiconductor layer SLn from the upper surface Sa of the semiconductor substrate SS, are disposed on both sides of the trench T1, and extend respectively in Y direction in plan view. As the gas for this anisotropic dry etching, $Cl_2/O_2$ system gas for example can be exemplified as a preferable one.

Figure 14:
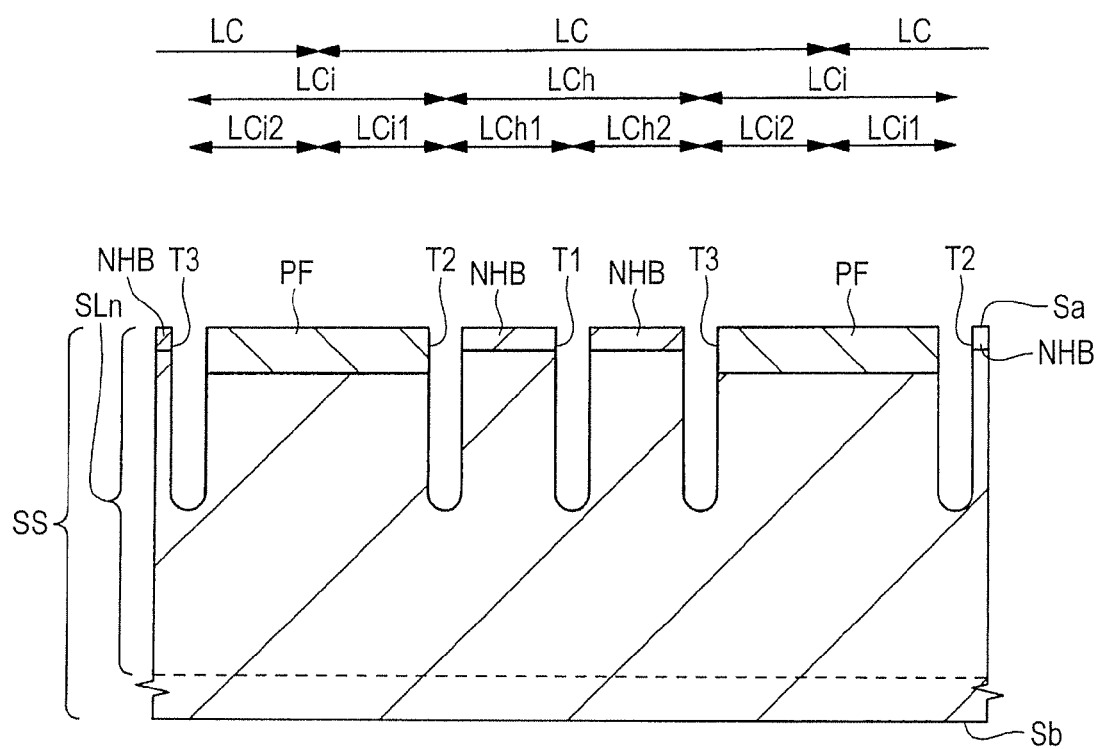
FIG. 14 is a cross-sectional view showing a manufacturing step of the semiconductor device of the first embodiment, and is a cross-sectional view showing a manufacturing step of the semiconductor device following FIG. 13.

Thereafter, as shown in FIG. 14, the hard mask film HM that has become unnecessary is removed by wet etching using fluoric acid system etching solution and the like for example.

Figure 15:
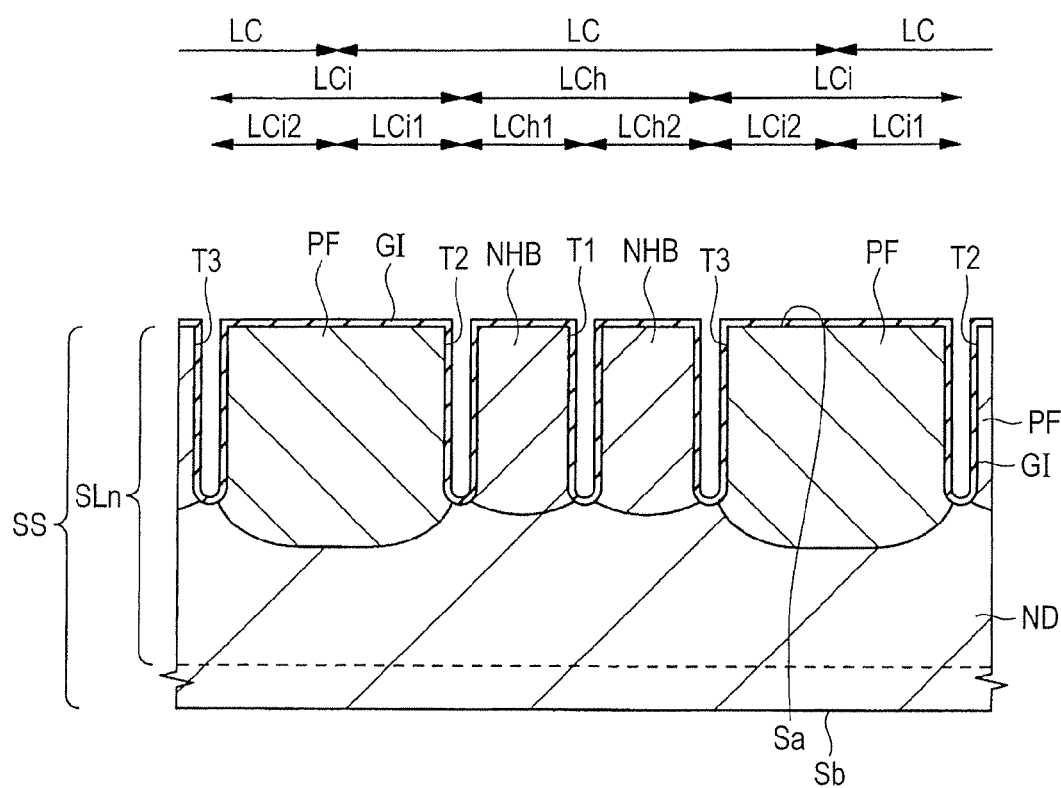
FIG. 15 is a cross-sectional view showing a manufacturing step of the semiconductor device of the first embodiment, and is a cross-sectional view showing a manufacturing step of the semiconductor device following FIG. 14.

Next, as shown in FIG. 15, stretching diffusion (approximately 1,200° C., 30 min for example) for the p-type floating region PF and the n-type hole barrier region NHB is executed. At this time, the stretching diffusion is executed so that the lower surface of the p-type floating region PF becomes lower than the lower surface of the trenches T1, T2, and T3.

Thus, the p-type floating region PF is formed between the trench T3 of the left end in FIG. 15 and the trench T2 next to it, and the p-type floating region PF is formed between the trench T2 of the right end in FIG. 15 and the trench T3 next to it. It is preferable that the p-type floating regions PF respectively come into contact with the gate insulating film GI that is formed over the inner wall of the trench T2 and the gate insulating film GI that is formed over the inner wall of the trench T3.

Also, the n-type hole barrier regions NHB are formed between the trench T1 and the trench T2 next to it, and between the trench T1 and the trench T3 next to it. It is preferable that the n-type hole barrier region NHB formed between the trench T1 and the trench T2 comes in contact with the gate insulating film GI formed over the inner wall of the trench T1 and the gate insulating film GI formed over the inner wall of the trench T2. Also, it is preferable that the n-type hole barrier region NHB formed between the trench T1 and the trench T3 comes in contact with the gate insulating film GI formed over the inner wall of the trench T1 and the gate insulating film GI formed over the inner wall of the trench T3.

Further, out of the semiconductor substrate SS of n-type, the region where the p-type floating region PF and the n-type hole barrier region NHB are not formed at the time of the stretching diffusion becomes the n$^-$-type drift region ND. In other words, out of the semiconductor layer SLn of n-type, the region where the p-type floating region PF and the n-type hole barrier region NHB are not formed becomes the n$^-$-type drift region ND. Also, in the step shown in FIG. 15, the n$^-$-type drift region ND is formed from the inside of the semiconductor layer SLn to the lower surface Sb of the semiconductor substrate SS.

Between the trench T1 and the trench T2, the concentration of the n-type impurities of the n-type hole barrier region NHB is higher than the concentration of the n-type impurities in the n$^-$-type drift region ND, and is lower than the concentration of the n-type impurities of the n⁺-type emitter region NE described below. Also, the situation between the trench T1 and the trench T3 is similar to that between the trench T1 and the trench T2.

Next, the gate insulating film GI formed of silicon oxide for example is formed over the upper surface Sa of the semiconductor substrate SS and over the inner wall of each of the trenches T1, T2, and T3 by the thermal oxidation method and the like for example. The thickness of the gate insulating film GI is approximately 0.12 μm for example.

Figure 16:
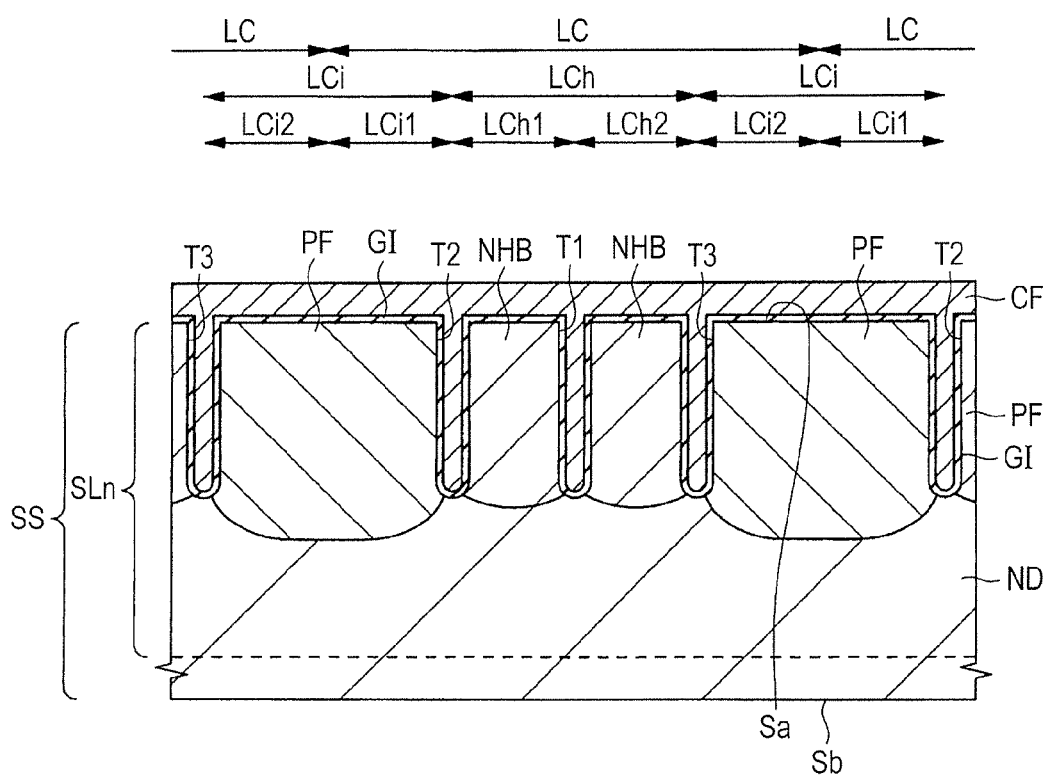
FIG. 16 is a cross-sectional view showing a manufacturing step of the semiconductor device of the first embodiment, and is a cross-sectional view showing a manufacturing step of the semiconductor device following FIG. 15.

Next, as shown in FIG. 16, a conductive film CF formed of poly-silicon in which phosphor (P) is doped is formed over the upper surface Sa of the semiconductor substrate SS and in the inside of the trenches T1, T2, and T3 by the CVD method and the like for example. The thickness of the conductive film CF is approximately 0.6 μm for example.

Figure 17:
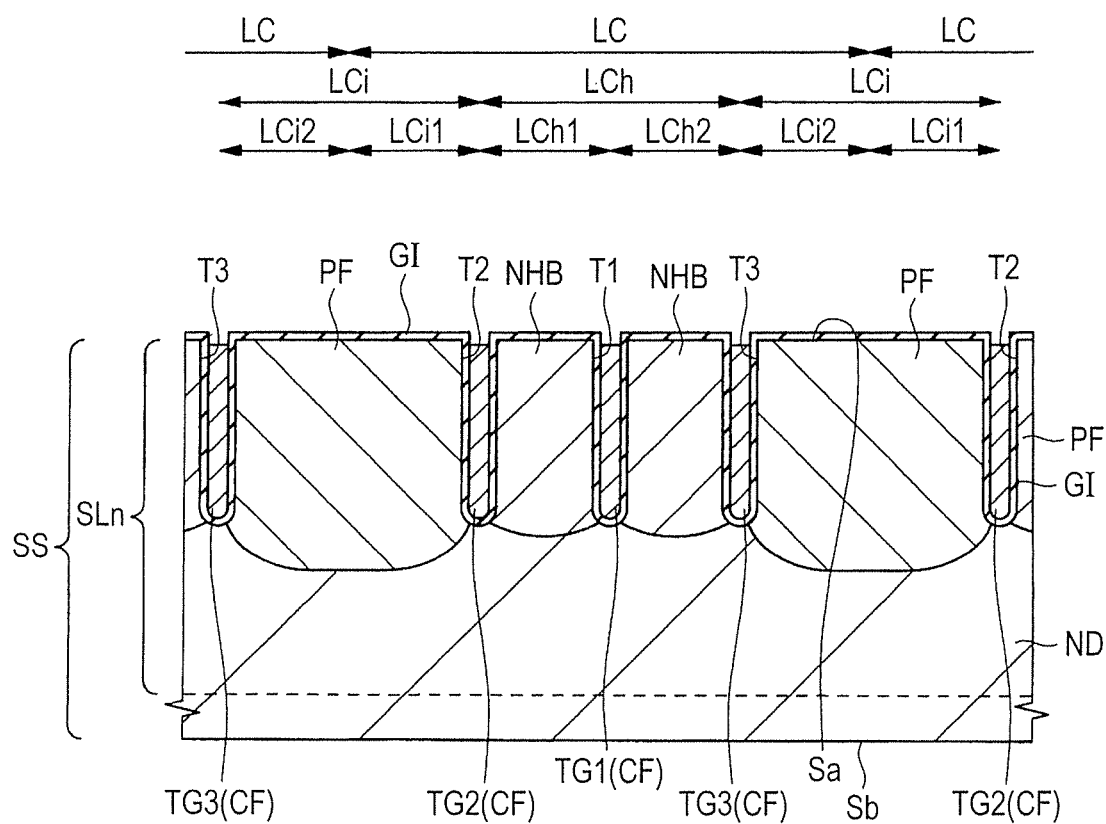
FIG. 17 is a cross-sectional view showing a manufacturing step of the semiconductor device of the first embodiment, and is a cross-sectional view showing a manufacturing step of the semiconductor device following FIG. 16.
Figure 18:
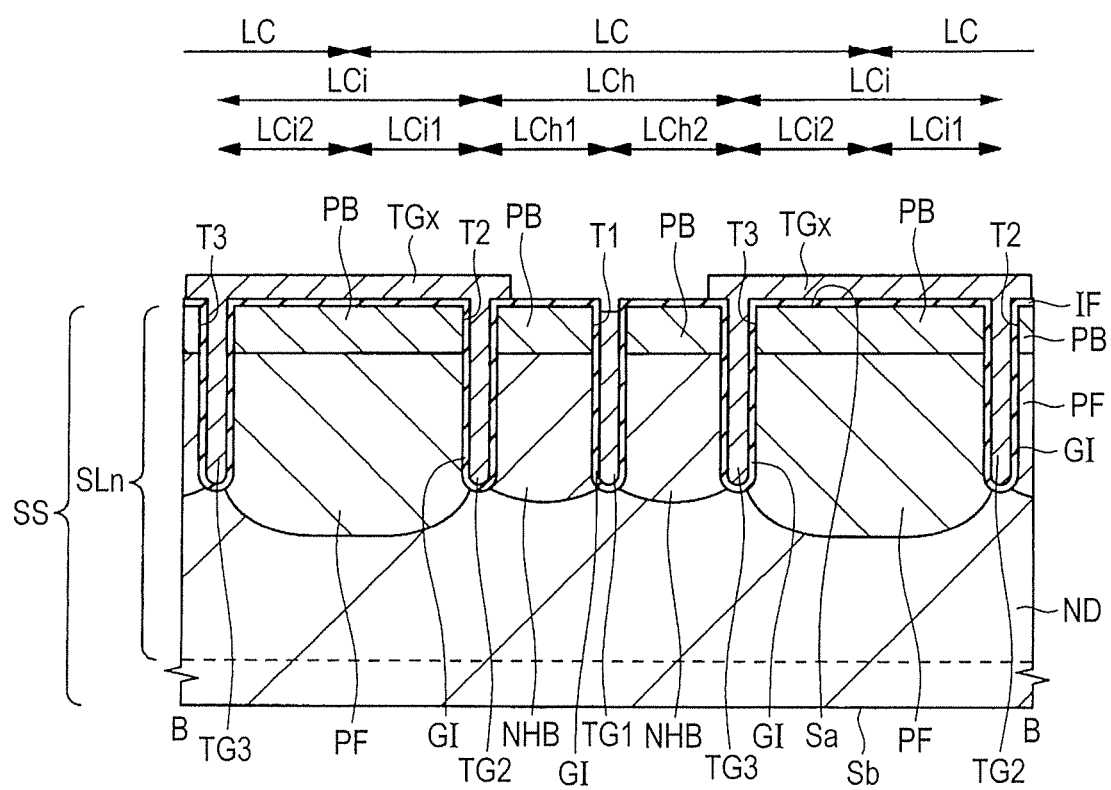
FIG. 18 is a cross-sectional view showing a manufacturing step of the semiconductor device of the first embodiment, and is a cross-sectional view showing a manufacturing step of the semiconductor device following FIG. 17.

Next, as shown in FIG. 17 and FIG. 18, the conductive film CF is patterned by dry etching and the like for example. A resist film (not illustrated) covering at least the emitter coupling section forming region is formed by photolithography for example, and the conductive film CF is patterned using this resist film as a mask. At this time, the etching condition is adjusted (etch back is executed) so that the conductive film CF remains in the inside of the trenches T1-T3. Thus, the trench gate electrode TG1 formed of the conductive film CF that is embedded in the inside of the trench T1 through the gate insulating film GI is formed. Also, the trench gate electrode TG2 formed of the conductive film CF that is embedded in the inside of the trench T2 through the gate insulating film GI is formed. Further, the trench gate electrode TG3 formed of the conductive film CF that is embedded in the inside of the trench T3 through the gate insulating film GI is formed. Also, the emitter coupling section TGx is formed (refer to FIG. 18, FIG. 2, and FIG. 3).

In other words, the trench gate electrode TG1 is formed over the gate insulating film GI so as to fill the trench T1, the trench gate electrode TG2 is formed over the gate insulating film GI so as to fill the trench T2, and the trench gate electrode TG3 is formed over the gate insulating film GI so as to fill the trench T3. Also the emitter coupling section TGx that traverses over the trench gate electrode TG2 and the trench gate electrode TG 3 is formed (refer to FIG. 18, FIG. 2, and FIG. 3). As the gas for this etching, $SF_6$ gas and the like for example can be exemplified as a preferable one.

Figure 19:
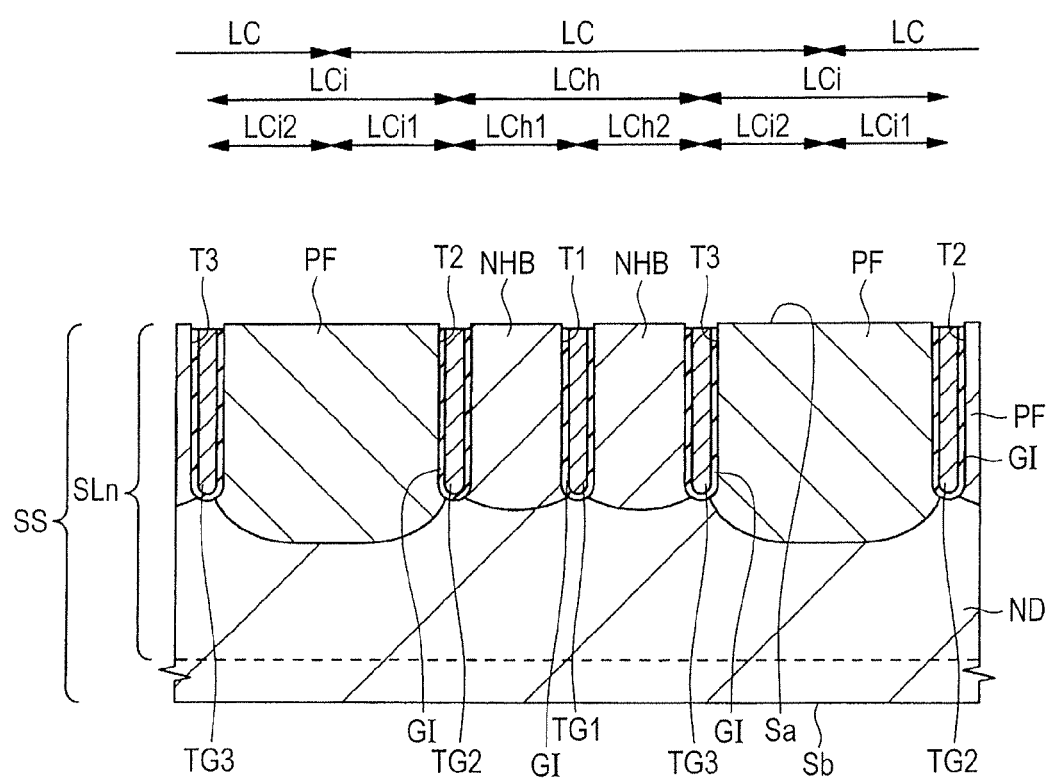
FIG. 19 is a cross-sectional view showing a manufacturing step of the semiconductor device of the first embodiment, and is a cross-sectional view showing a manufacturing step of the semiconductor device following FIG. 18.

Next, as shown in FIG. 19, the gate insulating films GI other than those in the inside of the trenches T1, T2, and T3 are removed by dry etching and the like.

Figure 20:
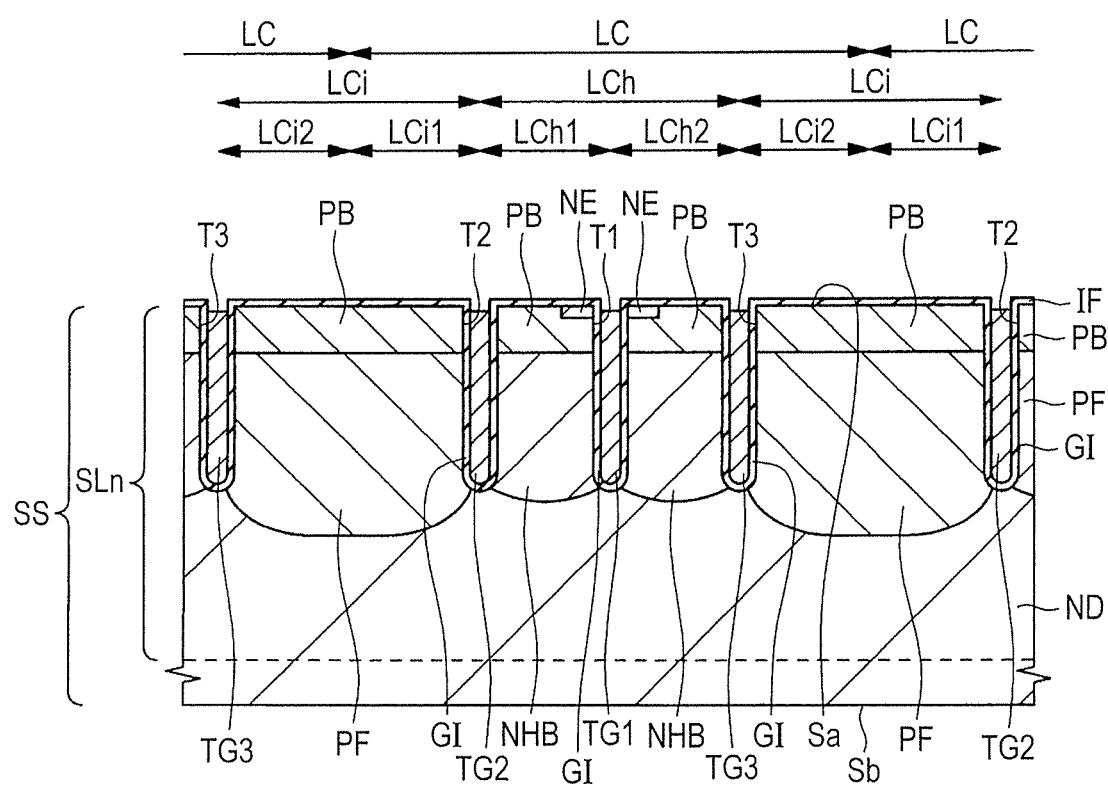
FIG. 20 is a cross-sectional view showing a manufacturing step of the semiconductor device of the first embodiment, and is a cross-sectional view showing a manufacturing step of the semiconductor device following FIG. 19.
Figure 21:
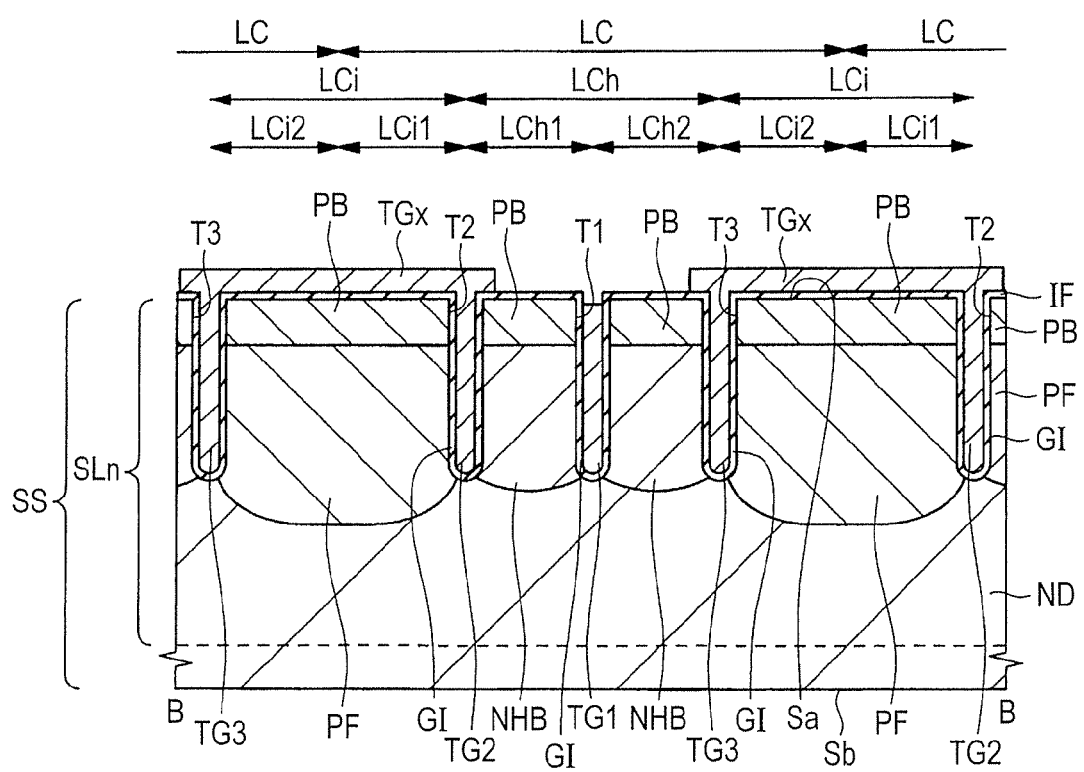
FIG. 21 is a cross-sectional view (B-B) showing a manufacturing step of the semiconductor device of the first embodiment.

Next, as shown in FIG. 20, the insulating film CF formed of a comparatively thin silicon oxide film (for example a similar degree to the gate insulating film GI) for ion injection to follow is formed over the upper surface Sa of the semiconductor substrate SS by the thermal oxidation method or CVD for example. Next, a resist film (illustration is omitted) for introducing the p-type body region is formed over the upper surface Sa of the semiconductor substrate SS by ordinary photolithography. The p-type body region PB is formed by introducing the p-type impurities to the entire surface of the cell forming region AR1 and other required portions by ion injection for example using this resist film for introducing the p-type body region as a mask.

To be more specific, the p-type body region PB that comes in contact with the gate insulating film GI formed over the inner wall of the trench T1 and the gate insulating film GI formed over the inner wall of the trench T2 is formed between the trench T1 and the trench T2. Also, the p-type body region PB that comes in contact with the gate insulating film GI formed over the inner wall of the trench T1 and the gate insulating film GI formed over the inner wall of the trench T3 is formed between the trench T1 and the trench T3. This p-type body region PB is formed over the n-type hole barrier region NHB. Also, in the inactive cell region LCi, this p-type body region PB is formed over the p-type floating region PF.

As the ion injection condition of this time, an ion injection condition in which the ion kind is made boron (B), the dose amount is made approximately $3\times10^{13}$ cm$^{-2}$, and the injection energy is made approximately 75 KeV for example can be exemplified as a preferable one. Thereafter, the resist film for introducing the p-type body region which has become unnecessary is removed by asking and the like.

Also, a resist film (not illustrated) for introducing the n⁺-type emitter region is formed over the upper surface Sa of the semiconductor substrate SS by ordinary photolithography. The n⁺-type emitter region NE is formed by introducing the n-type impurities to the upper layer of the p-type body region PB of the hybrid cell region LCh by ion injection for example using this resist film for introducing the n⁺-type emitter region as a mask. As the ion injection condition of this time, an ion injection condition in which the ion kind is made arsenic (As), the dose amount is made approximately $5\times10^{15}$ cm$^{-2}$, and the injection energy is made approximately 80 KeV for example can be exemplified as a preferable one.

This n⁺-type emitter region NE is formed only on the trench gate electrode TG1 side in the hybrid sub-cell regions LCh1 and LCh2. More specifically, the n⁺-type emitter region NE that comes in contact with the gate insulating film GI formed over the inner wall of the trench T1 and the p-type body region PB is formed between the trench T1 and the trench T2. Also, the n⁺-type emitter region NE that comes in contact with the gate insulating film GI formed over the inner wall of the trench T1 and the p-type body region PB is formed between the trench T1 and the trench T3.

Also, as described above, the n⁺-type emitter region NE is disposed by plural numbers at a predetermined distance (LCai) in Y direction (refer to FIG. 2 and FIG. 3). Further, as described above, the n⁺-type emitter region NE is disposed so as to be apart from the end of the contact trench CT by the distance D1 (refer to FIG. 3). Therefore, the n⁺-type emitter region NE does not appear in the cross-sectional view shown in FIG. 21 (the section B-B of FIG. 3) and the like for example.

Thereafter, the resist film for introducing the n⁺-type emitter region which has become unnecessary is removed by asking and the like.

Figure 22:
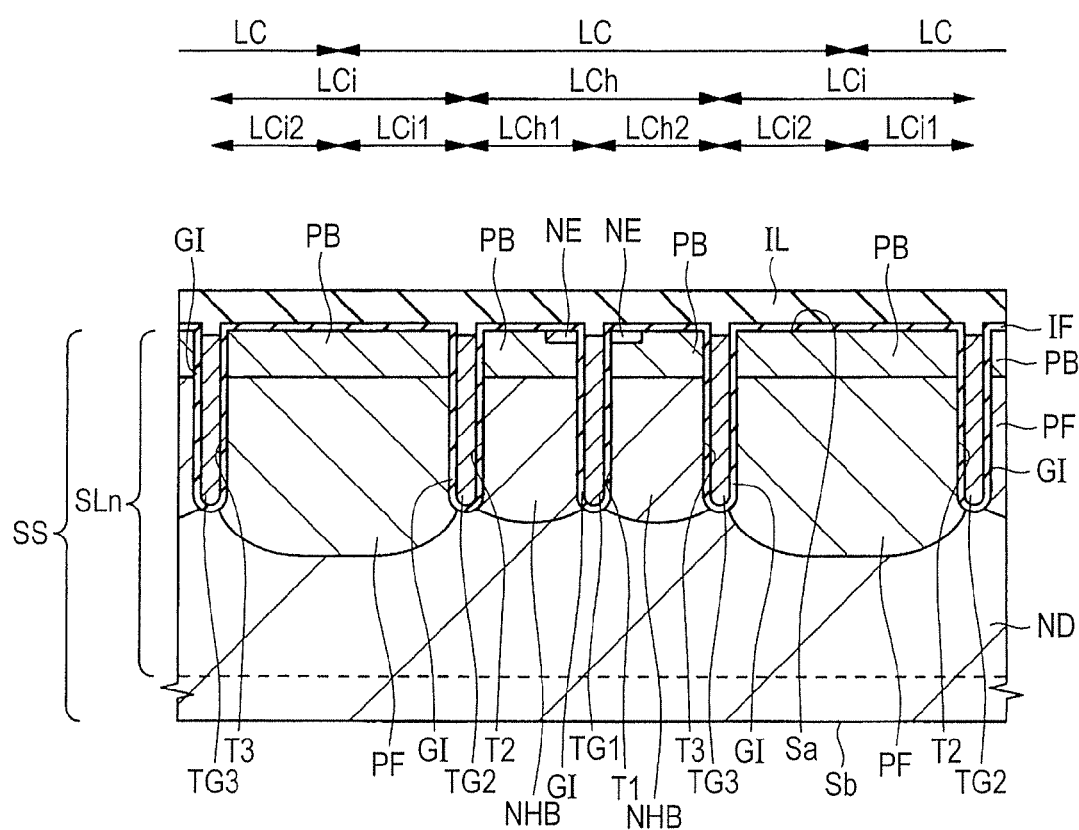
FIG. 22 is a cross-sectional view showing a manufacturing step of the semiconductor device of the first embodiment, and is a cross-sectional view showing a manufacturing step of the semiconductor device following FIG. 20.
Figure 23:
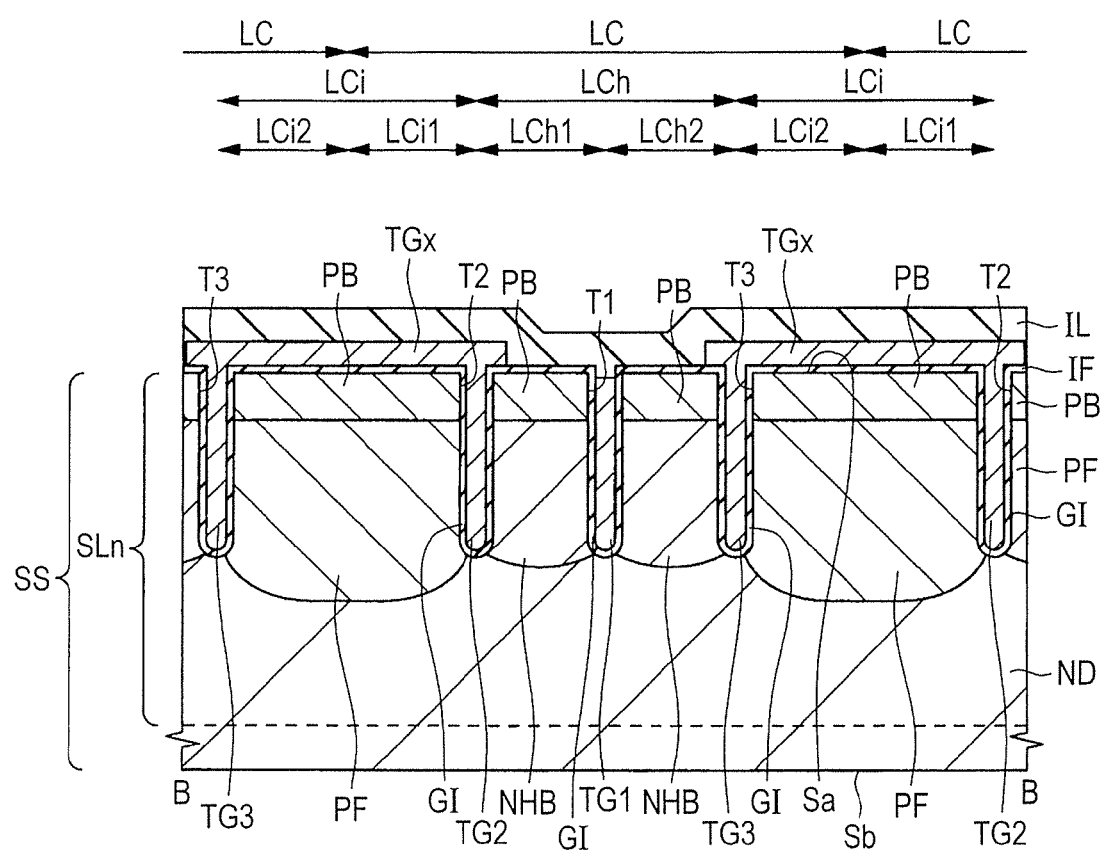
FIG. 23 is a cross-sectional view (B-B) showing a manufacturing step of the semiconductor device of the first embodiment, and is a cross-sectional view showing a manufacturing step of the semiconductor device following FIG. 21.
Figure 24:
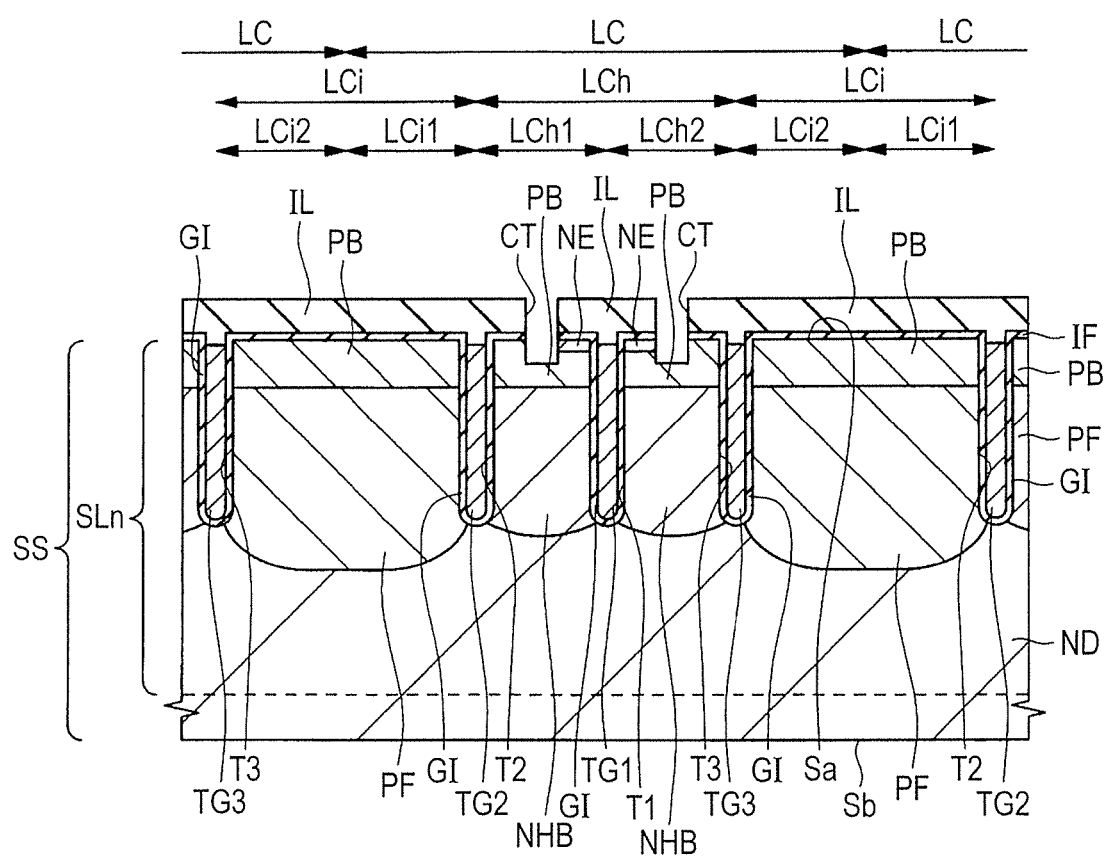
FIG. 24 is a cross-sectional view showing a manufacturing step of the semiconductor device of the first embodiment, and is a cross-sectional view showing a manufacturing step of the semiconductor device following FIG. 22.
Figure 25:
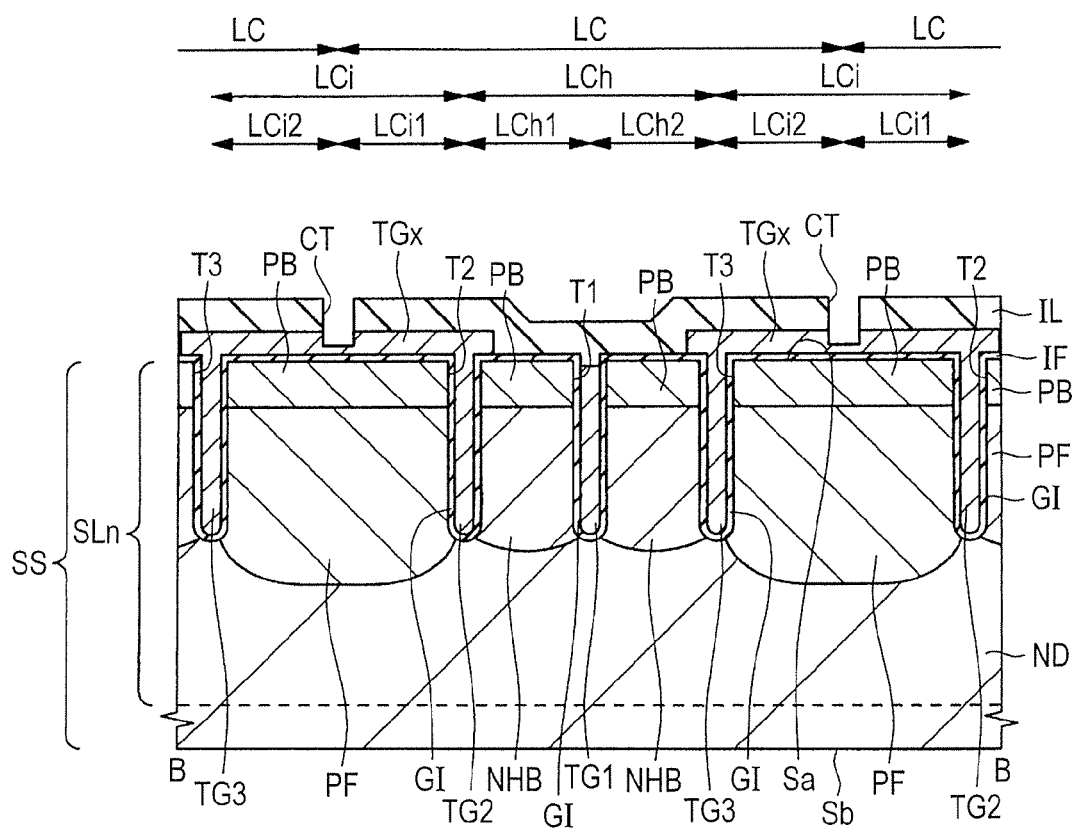
FIG. 25 is a cross-sectional view (B-B) showing a manufacturing step of the semiconductor device of the first embodiment, and is a cross-sectional view showing a manufacturing step of the semiconductor device following FIG. 23.

Next, as shown in FIG. 22 and FIG. 23, the interlayer insulating film IL formed of a PSG (Phosphosilicate Glass) film for example is formed over the upper surface Sa of the semiconductor substrate SS by the CVD method and the like for example. The interlayer insulating film IL is formed so as to cover the p-type body region PB through the insulating film IF. The thickness of the interlayer insulating film IL is approximately 0.6 μm for example. As the material of this interlayer insulating film IL, in addition to the PSG film, a BPSG (Borophosphosilicate Glass) film, an NSG (Non-doped Silicate Glass) film, an SOG (Spin-On-Glass) film, or a composite film thereof and so on can be exemplified as a preferable one.

Here, when the interlayer insulating film IL is formed over the upper surface Sa of the semiconductor substrate SS, in the cross section shown in FIG. 23 (the cross section B-B of FIG. 3), an unevenness (step) occurs on the surface of the interlayer insulating film IL. To be more specific, in the inactive cell region LCi, the emitter coupling section TGx that couples the trench T2 and the trench T3 exists in the lower layer of the interlayer insulating film IL. Therefore, a height difference is caused between the surface of the interlayer insulating film IL in the inactive cell region LCi and the surface of the interlayer insulating film IL of the hybrid cell region LCh that is positioned between the inactive cell regions LCi. In concrete terms, the surface of the interlayer insulating film IL of the hybrid cell region LCh is lower than the surface of the interlayer insulating film IL in the inactive cell region LCi. Also, when the width Wh of the hybrid cell region LCh is narrower than the width Wi of the inactive cell regions LCi (refer to FIG. 2), a recess with a narrow width is generated in the hybrid cell region LCh.

Next, as shown in FIG. 24-FIG. 28, a resist film (illustration is omitted) for forming a contact trench is formed over the interlayer insulating film IL by ordinary photolithography. Then, the contact trench CT is formed by the anisotropic dry etching and the like for example. To be more specific, the contact trench CT that comes in contact with the $n^+$-type emitter region NE and the contact trench CT over the emitter coupling section TGx are formed (refer to FIG. 3). As the gas used for this anisotropic dry etching, Ar gas, a gas mixture formed of $CHF_3$ gas and $CF_4$ gas, and the like for example can be exemplified as a preferable one.

FIG. 24-FIG. 28 respectively correspond to the cross sections A-A, B-B, C-C, D-D, and E-E of FIG. 3 for example. As shown in these drawings, the contact trench CT that comes in contact with the $n^+$-type emitter region NE does not appear in the cross sections B-B and D-D. To be more specific, as explained referring to FIG. 3, in the present embodiment, because the contact trench CT that comes in contact with the $n^+$-type emitter region NE is disposed dividedly so as to avoid the crossing region of the extending regions of the hybrid cell region LCh and the emitter coupling section TGx, this contact trench CT does not appear in the cross sections B-B and D-D.

In other words, in the crossing region described above (the cross section B-B shown in FIG. 25 for example), it is not necessary to form the contact trench CT. Therefore, as explained referring to FIG. 7, the working failure of the contact trench CT attributable to the unevenness (step) of the surface of the interlayer insulating film IL can be reduced.

Also, as described above, the $n^+$-type emitter region NE is disposed by plural numbers at a predetermined distance (LCai) in Y direction (refer to FIG. 2 and FIG. 3). On the other hand, the $n^+$-type emitter region NE is disposed so as to be apart from the end of the contact trench CT by the distance D1. In other words, the $n^+$-type emitter region NE is disposed so as not to include the end of the contact trench CT.

Figure 26:
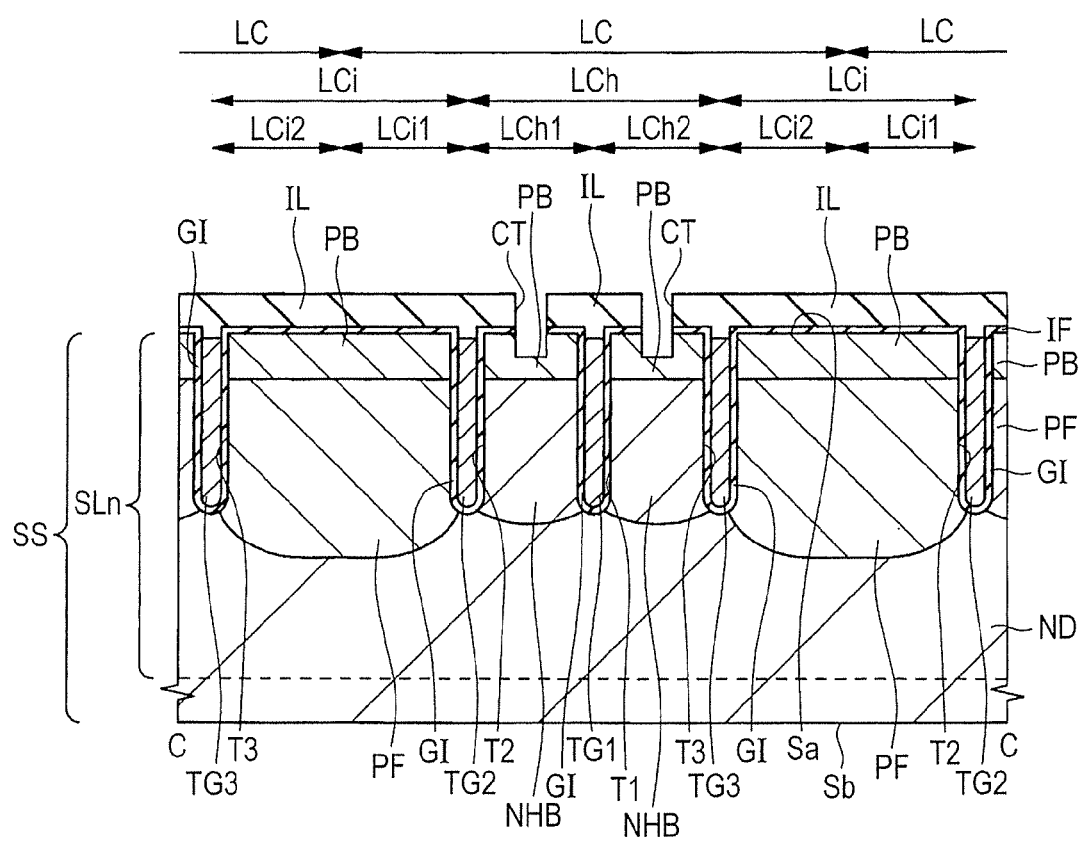
FIG. 26 is a cross-sectional view (C-C) showing a manufacturing step of the semiconductor device of the first embodiment.
Figure 27:
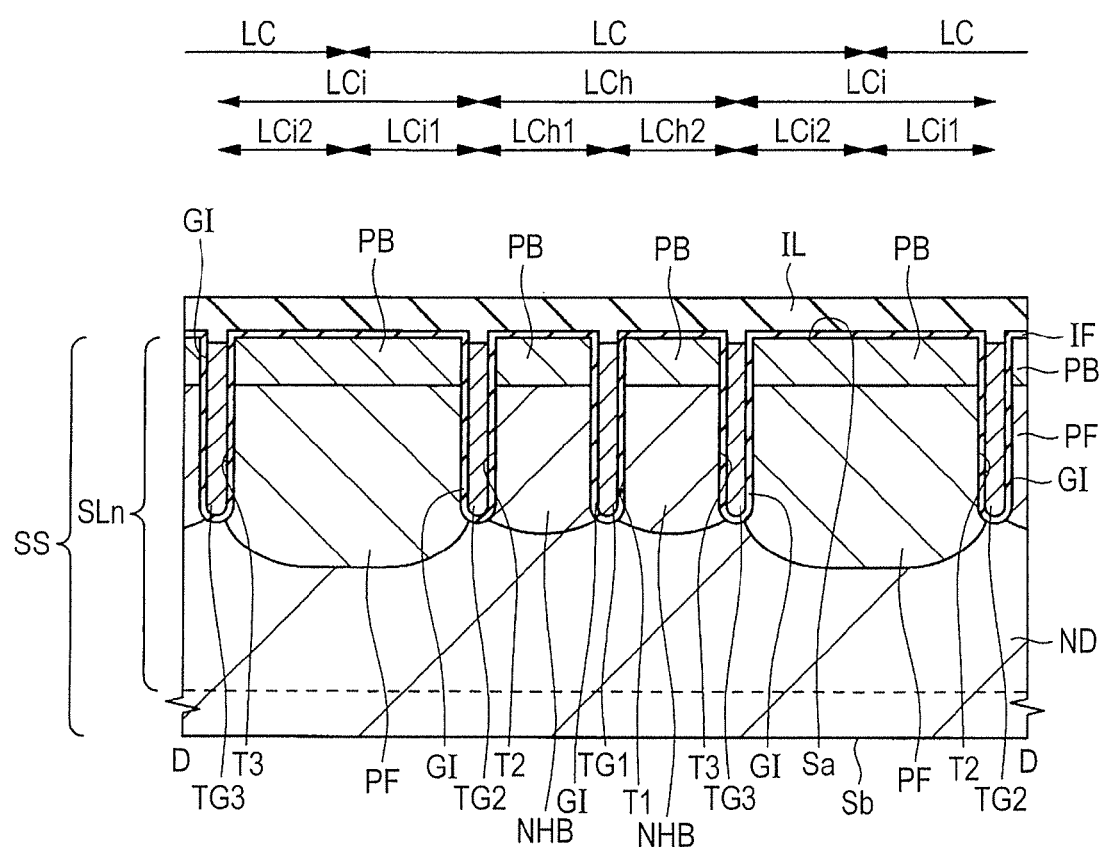
FIG. 27 is a cross-sectional view (D-D) showing a manufacturing step of the semiconductor device of the first embodiment.
Figure 28:
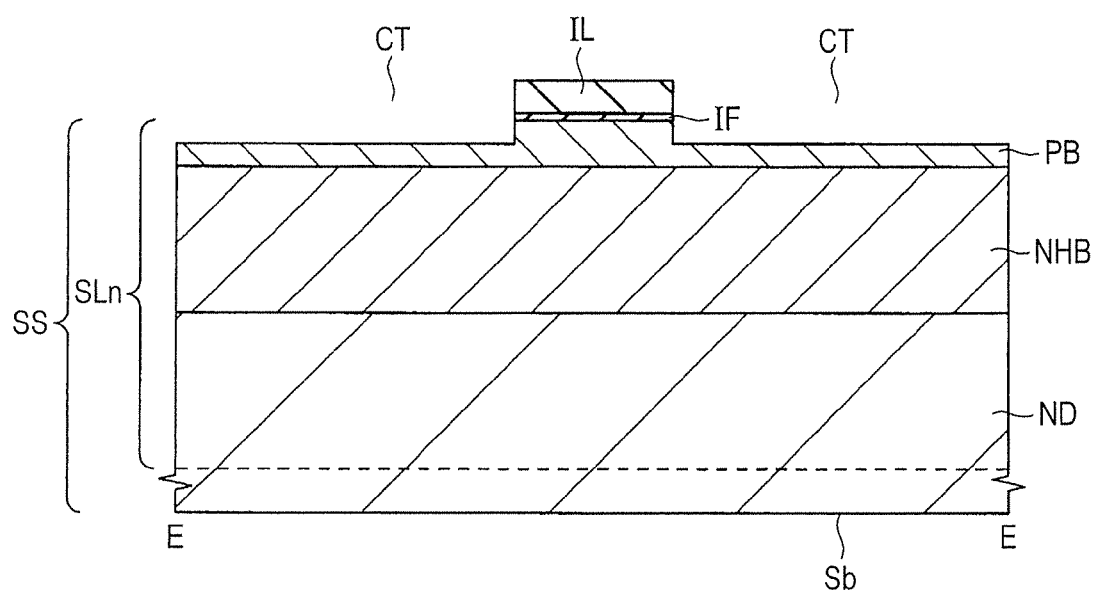
FIG. 28 is a cross-sectional view (E-E) showing a manufacturing step of the semiconductor device of the first embodiment.

Therefore, in FIG. 26 (the cross section C-C shown in FIG. 3) for example, although the contact trench CT is formed, the $n^+$-type emitter region NE does not appear. Also, in the cross section E-E of FIG. 3 shown in FIG. 28, the $n^+$-type emitter region NE is not disposed in the back direction of the paper surface of the end of the contact trench CT. Therefore, formation of the parasitic NPN-Bipolar transistor explained referring to FIG. 8 can be avoided. Accordingly, the breakdown of the semiconductor device possibly caused by the on-operation of this parasitic NPN-Bipolar transistor can be suppressed, and the breakdown resistance of the semiconductor device can be improved.

Thereafter, the resist film for forming the contact trench which has become unnecessary is removed by asking and the like.

Figure 29:
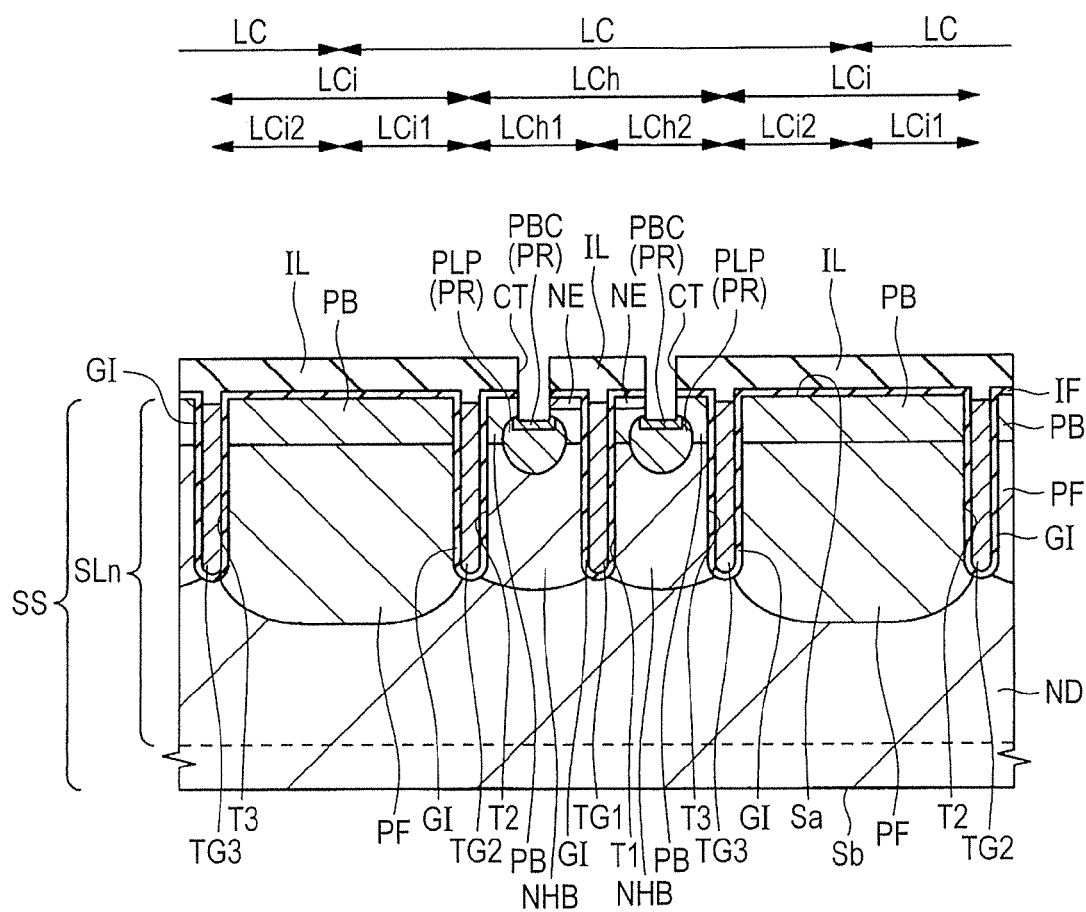
FIG. 29 is a cross-sectional view showing a manufacturing step of the semiconductor device of the first embodiment, and is a cross-sectional view showing a manufacturing step of the semiconductor device following FIG. 24.

Next, as shown in FIG. 29, the $p^+$-type body contact region PBC is formed by ion injection of the p-type impurities through the contact trench CT for example. Here, as the ion injection condition, an ion injection condition in which the ion kind is made $BF_2$, the dose amount is made approximately $5 \times 10^{15}$ cm$^{-2}$, and the injection energy is made approximately 80 KeV for example can be exemplified as a preferable one.

In a similar manner, by ion injection of the p-type impurities through the contact trench CT for example, the $p^+$-type latch-up preventing region PLP is formed. Here, as the ion injection condition, an ion injection condition in which the ion kind is made boron (B), the dose amount is made approximately $3 \times 10^{15}$ cm$^{-2}$, and the injection energy is made approximately 80 KeV for example can be exemplified as a preferable one. The concentration of the p-type impurities in the $p^+$-type body contact region PBC is higher than the concentration of the p-type impurities in the $p^+$-type latch-up preventing region PLP. Also, the $p^+$-type semiconductor region PR is formed by the $p^+$-type body contact region PBC and the $p^+$-type latch-up preventing region PLP. The concentration of the p-type impurities in each of the plural $p^+$-type semiconductor regions PR is higher than the concentration of the p-type impurities in the p-type body region PB.

Figure 30:
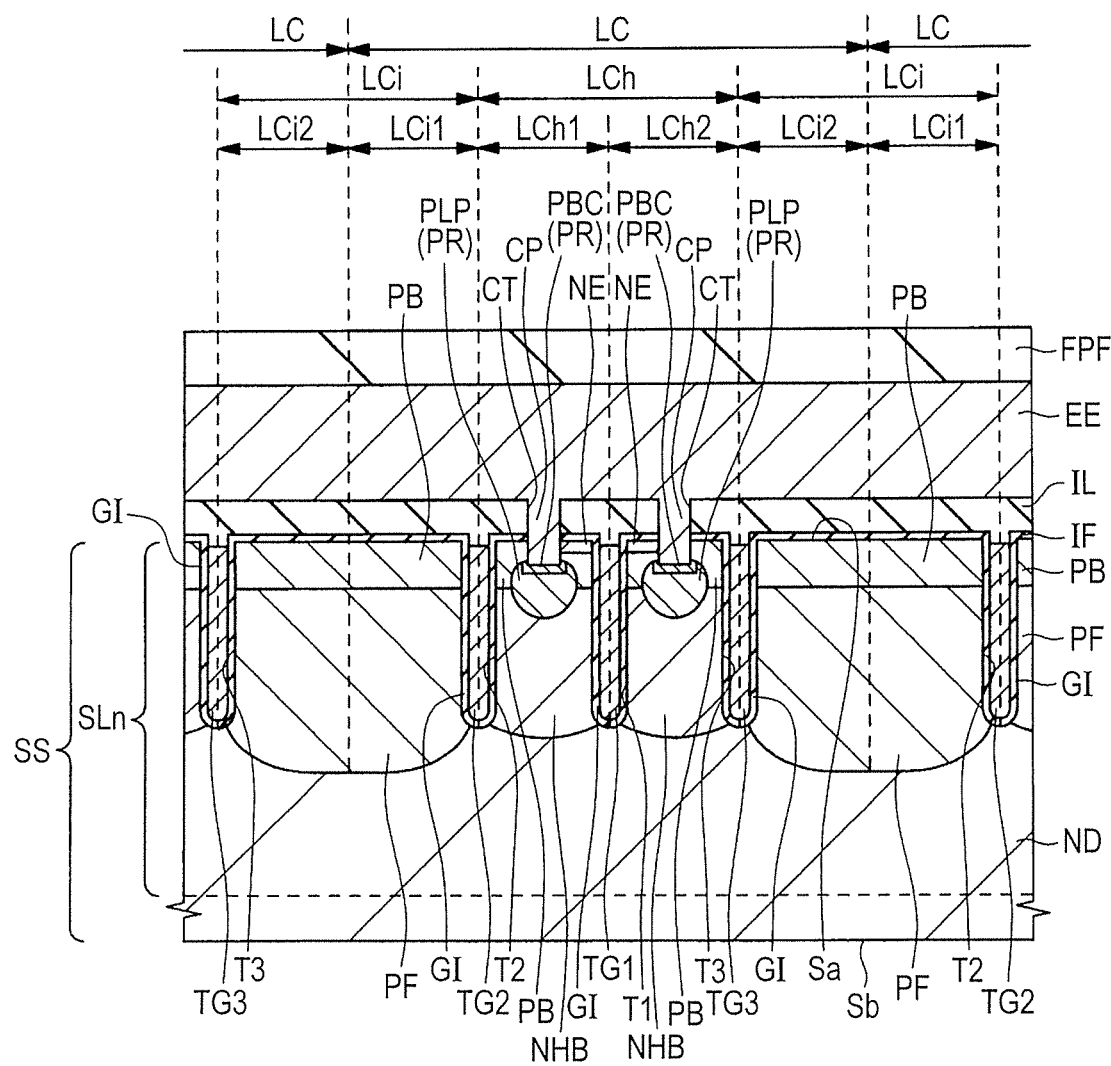
FIG. 30 is a cross-sectional view showing a manufacturing step of the semiconductor device of the first embodiment, and is a cross-sectional view showing a manufacturing step of the semiconductor device following FIG. 29.
Figure 31:
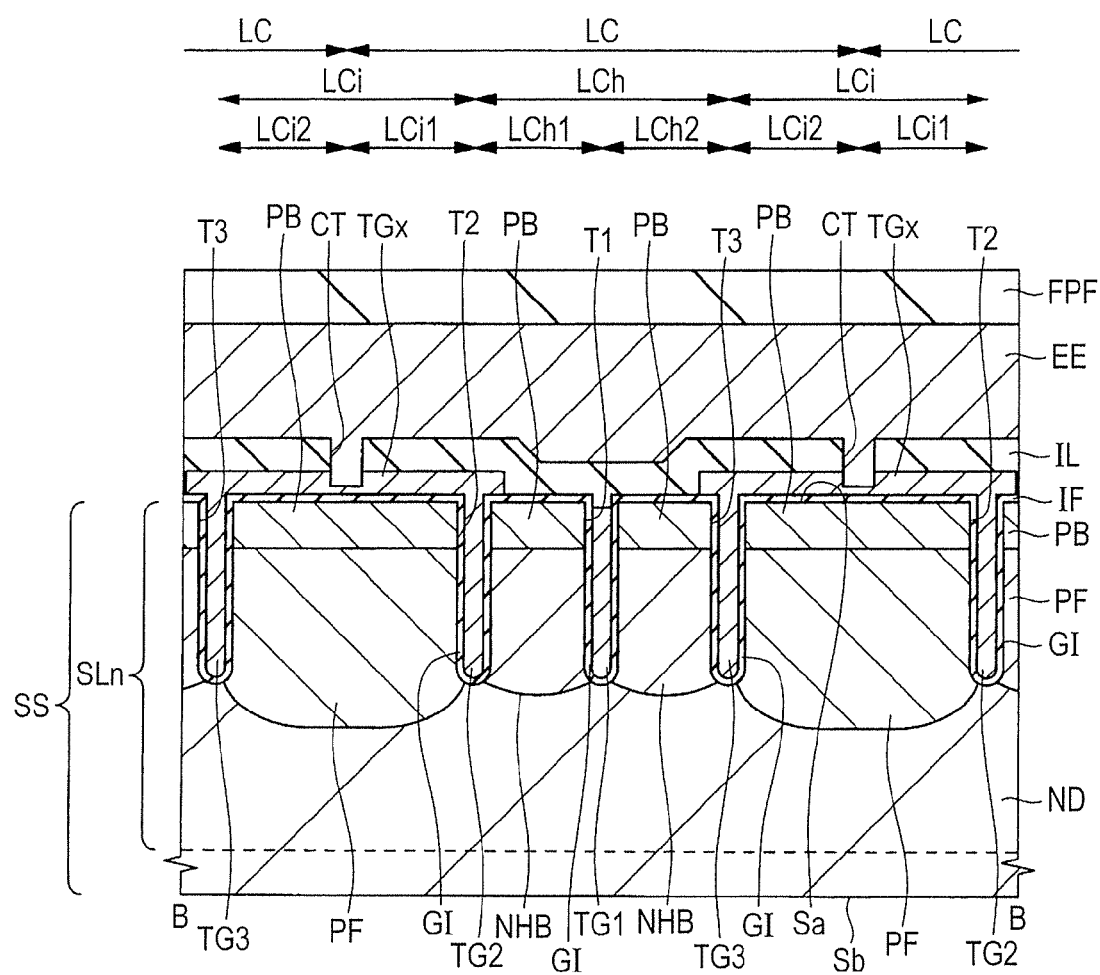
FIG. 31 is a cross-sectional view (B-B) showing a manufacturing step of the semiconductor device of the first embodiment.

Next, as shown in FIG. 30 and FIG. 31, the emitter electrode EE is formed. In concrete terms, the following procedure for example is executed. First, a TiW film is formed over the upper surface Sa of the semiconductor substrate SS as a barrier metal film by sputtering for example. The thickness of the TiW film is approximately 0.2 μm for example. The major portion of titanium within the TiW film moves to the silicon interface by the heat treatment to follow, forms silicide, and contributes to improvement of the contact property, however, because the step of them is complicate, it is not shown in the drawings.

Next, after silicide annealing of approximately 600° C. and approximately 10 min for example is executed in a nitrogen atmosphere, an aluminum system metal film (for example several % of silicon is added, the remainder is aluminum) is formed in the entire surface over the barrier metal film by sputtering for example so as fill the contact trench CT. The thickness of the aluminum system metal film is approximately 5 μm for example.

Next, a resist film (illustration is omitted) for forming the emitter electrode is formed by ordinary photolithography. Then, the emitter electrode EE formed of the aluminum system metal film and the barrier metal film is patterned by dry etching for example. As the gas for this dry etching, a $Cl_2/BCl_3$ gas and the like for example can be exemplified as a preferable one. Thereafter, the resist film for forming the emitter electrode which has become unnecessary is removed by asking and the like.

Thus, in the hybrid sub-cell region LCh1, the plural coupling electrodes CP embedded respectively in the inside of the plural contact trenches CT and the emitter electrode EE formed over the interlayer insulating film IL are formed.

The emitter electrode EE is electrically coupled with the $n^+$-type emitter region NE formed in each of the hybrid sub-cell regions LCh1 and LCh2 and the plural $p^+$-type semiconductor regions PR through the plural coupling electrodes CP which are formed in the hybrid sub-cell region. Also, when the emitter electrode EE is formed, the gate electrode GE (refer to FIG. 4) electrically coupled with the trench gate electrode TG1 may be formed.

Further, when the emitter electrode EE is formed in the cell forming region AR1 (refer to FIG. 2), a gate wiring GL and the gate electrode GE (refer to FIG. 4) can be formed in the gate wiring draw-out region AR2 (refer to FIG. 2).

Figure 32:
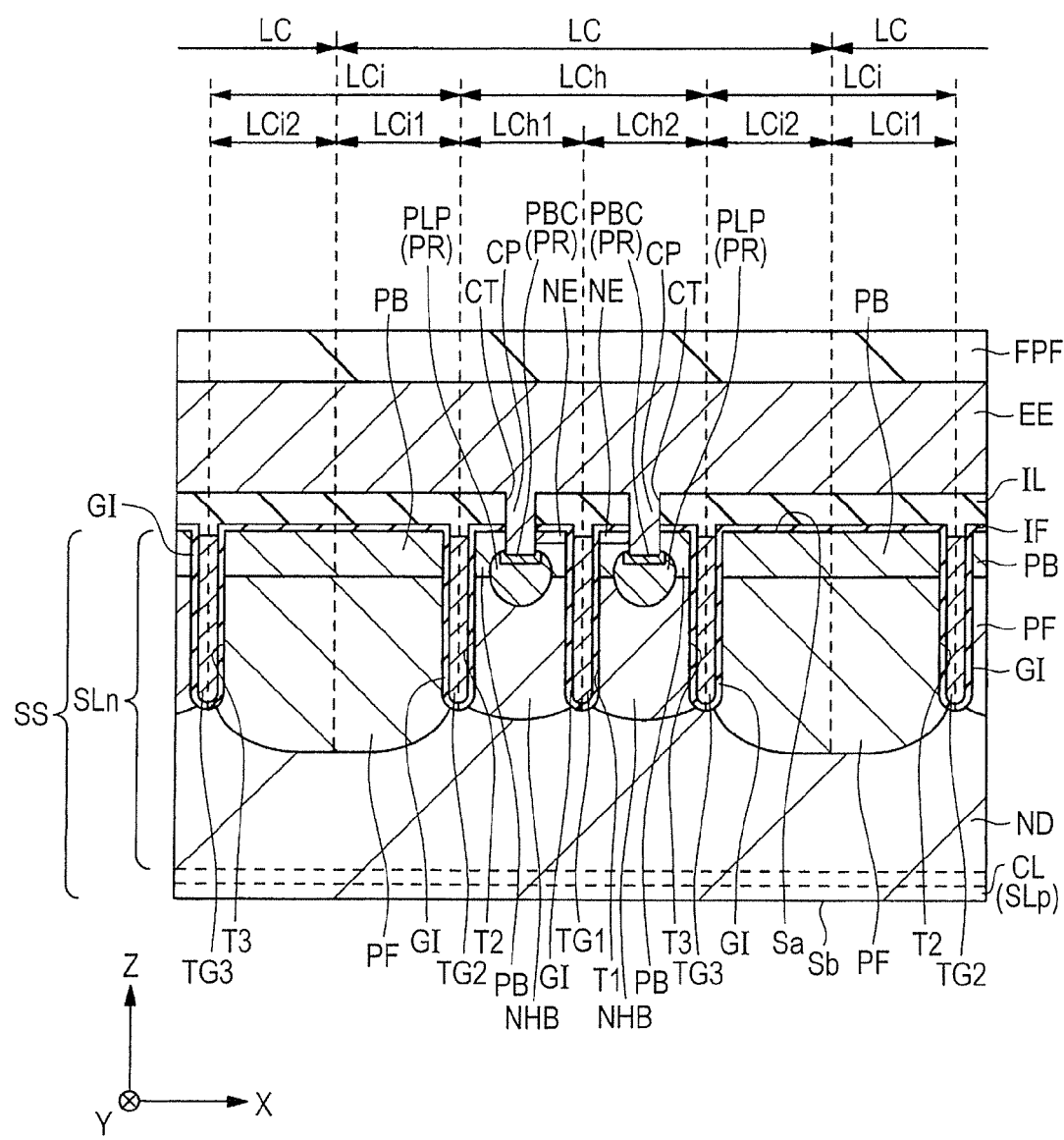
FIG. 32 is a cross-sectional view showing a manufacturing step of the semiconductor device of the first embodiment, and is a cross-sectional view showing a manufacturing step of the semiconductor device following FIG. 30.

Next, as shown in FIG. 32, the insulating film (passivation film) FPF formed of an organic film and the like having the main composition of polyimide for example is formed over the emitter electrode EE. The thickness of the insulating film FPF is approximately 2.5 μm for example.

Next, a resist film (illustration is omitted) for forming an opening is formed by ordinary photolithography. Then, an opening OP1 (refer to FIG. 4) that penetrates the insulating film FPF and reaches the emitter electrode EE is formed by patterning the insulating film FPF by dry etching for example, and an emitter pad EP (refer to FIG. 4) formed of the emitter electrode EE of a portion exposed to the opening OP1 is formed. Also, thereafter, the resist film for forming the opening which has become unnecessary is removed by asking and the like.

Further, when the insulating film FPF is formed over the emitter electrode EE in the cell forming region AR1 (refer to FIG. 4), the insulating film FPF is formed over the gate electrode GE (refer to FIG. 4) in the gate wiring draw-out region AR2 (refer to FIG. 4). Also, when the opening OP1 is formed in the cell forming region AR1 (refer to FIG. 4), an opening AR2 (refer to FIG. 4) that penetrates the insulating film FPF and reaches the gate electrode GE is formed in the gate wiring draw-out region AR2 (refer to FIG. 4), and a gate pad GP formed of the gate electrode GE of a portion exposed to the opening OP2 is formed.

Next, as shown in FIG. 32, by subjecting the lower surface Sb of the semiconductor substrate SS to back grinding processing, the thickness of approximately 800 μm for example is made thin to approximately 30 μm-200 μm for example according to the necessity. When the breakdown voltage is approximately 600 V for example, the final thickness is approximately 70 μm. Thus, in this semiconductor substrate SS that has been made a thin film, the semiconductor layer SLp is formed in the inside of the semiconductor substrate SS of a portion positioned on the lower surface Sb side with respect to the semiconductor layer SLn. Also, chemical etching and the like for removing the damage of the lower surface Sb is also executed according to the necessity.

Out of this semiconductor substrate SS that has been made a thin film, a semiconductor layer that is a semiconductor layer on the lower surface Sb side with respect to the semiconductor layer where the n-type field stop region Ns (refer to FIG. 1) is formed and where the p$^+$-type collector region CL (refer to FIG. 1) is formed is made the semiconductor layer SLp.

Next, as shown in FIG. 1, the n-type field stop region Ns is formed by introducing the n-type impurities to the lower surface Sb of the semiconductor substrate SS by ion injection for example. Here, as the ion injection condition, an ion injection condition in which the ion kind is made phosphor (P), the dose amount is made approximately $7 \times 10^{22}$ cm$^{-2}$, and the injection energy is made approximately 350 KeV for example can be exemplified as a preferable one. Thereafter, laser annealing and the like is executed for the lower surface Sb of the semiconductor substrate SS for activating the impurities according to the necessity.

Next, the p$^+$-type collector region CL is formed by introducing the p-type impurities to the lower surface Sb of the semiconductor substrate SS by ion injection for example. Here, as the ion injection condition, an ion injection condition in which the ion kind is made boron (B), the dose amount is made approximately $1 \times 10^{13}$ cm$^{-2}$, and the injection energy is made approximately 40 KeV for example can be exemplified as a preferable one. Thereafter, laser annealing and the like is executed for the lower surface Sb of the semiconductor substrate SS for activating the impurities according to the necessity.

That is to say, in the step for forming the p$^+$-type collector region CL, the semiconductor layer SLp of p-type is formed within the semiconductor substrate SS of a portion positioned on the lower surface Sb side with respect to the semiconductor layer SLn, and the p$^+$-type collector region CL is formed by the semiconductor layer SLp of p-type.

Next, the collector electrode CE that is electrically coupled with the semiconductor layer SLp namely the p$^+$-type collector region CL is formed over the lower surface Sb of the semiconductor substrate SS by sputtering for example. Thereafter, the semiconductor device is divided into the chip region of the semiconductor substrate SS by dicing and the like and is sealed into a package according to the necessity, and the semiconductor device of the present embodiment is thereby completed.

Second Embodiment

In the first embodiment, the height of the upper surface of the trench gate electrodes TG2, TG3 was made generally same as that of the upper surface of the trench gate electrode TG1, however, the upper surface of the trench gate electrodes TG2, TG3 may be made lower than the upper surface of the trench gate electrode TG1.

Below, a semiconductor device of the present embodiment will be explained in detail referring to the drawings. The semiconductor device of the present embodiment is an IGBT of the IE type similarly to the case of the first embodiment. Also, similarly to the case of the first embodiment, the semiconductor device of the present embodiment is of the EGE type (Emitter-Gate-Emitter type) in which, out of three trench gate electrodes arrayed so as to be apart from each other, a trench gate electrode (TG1) disposed in the center is electrically coupled with the gate electrode and each of two trench gate electrodes (TG2, TG3) disposed in both ends is electrically coupled with the emitter electrode.

[Explanation of Structure]

Figure 33:
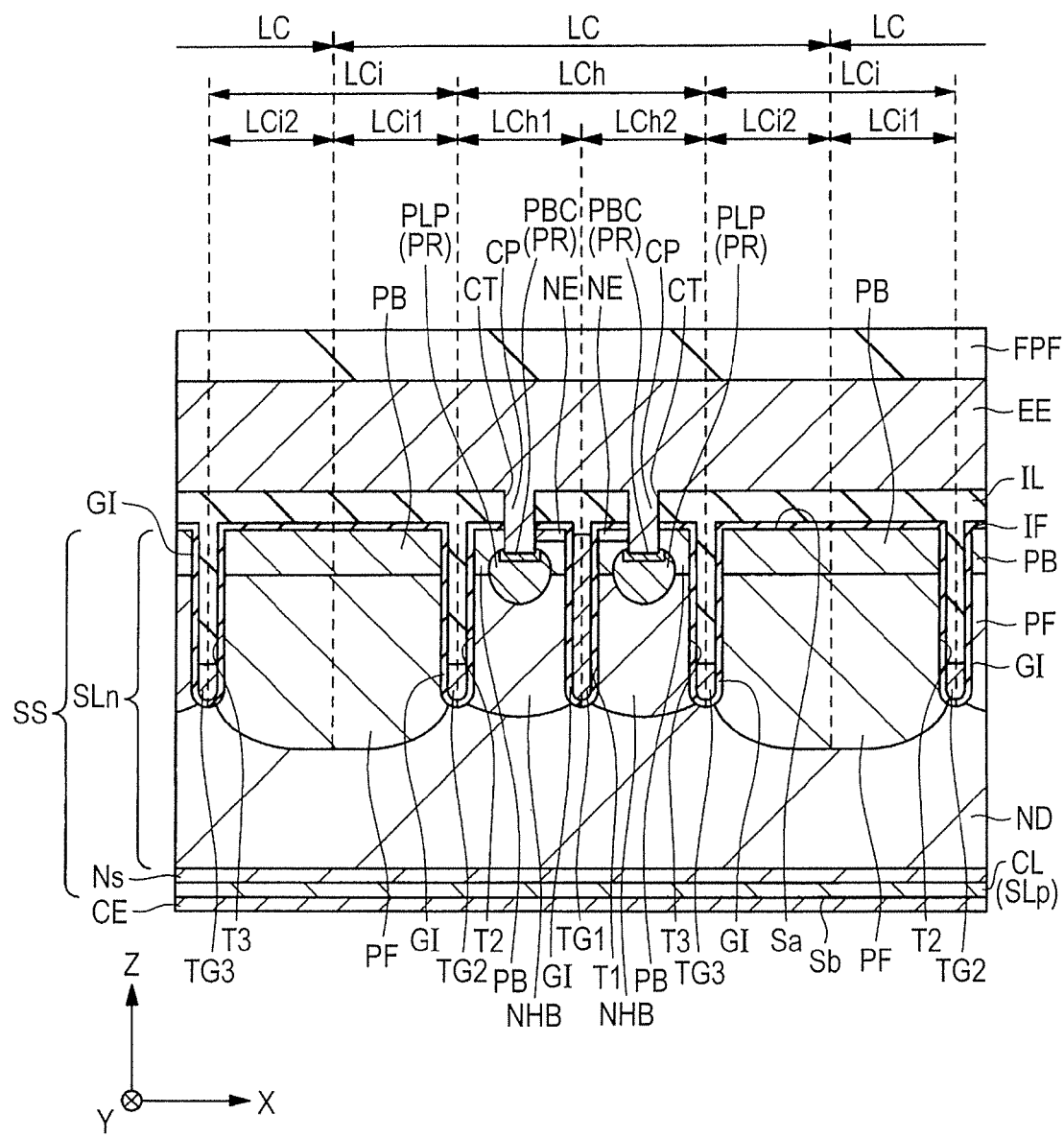
FIG. 33 is a cross-sectional view showing a configuration of a semiconductor device of the second embodiment.
Figure 34:
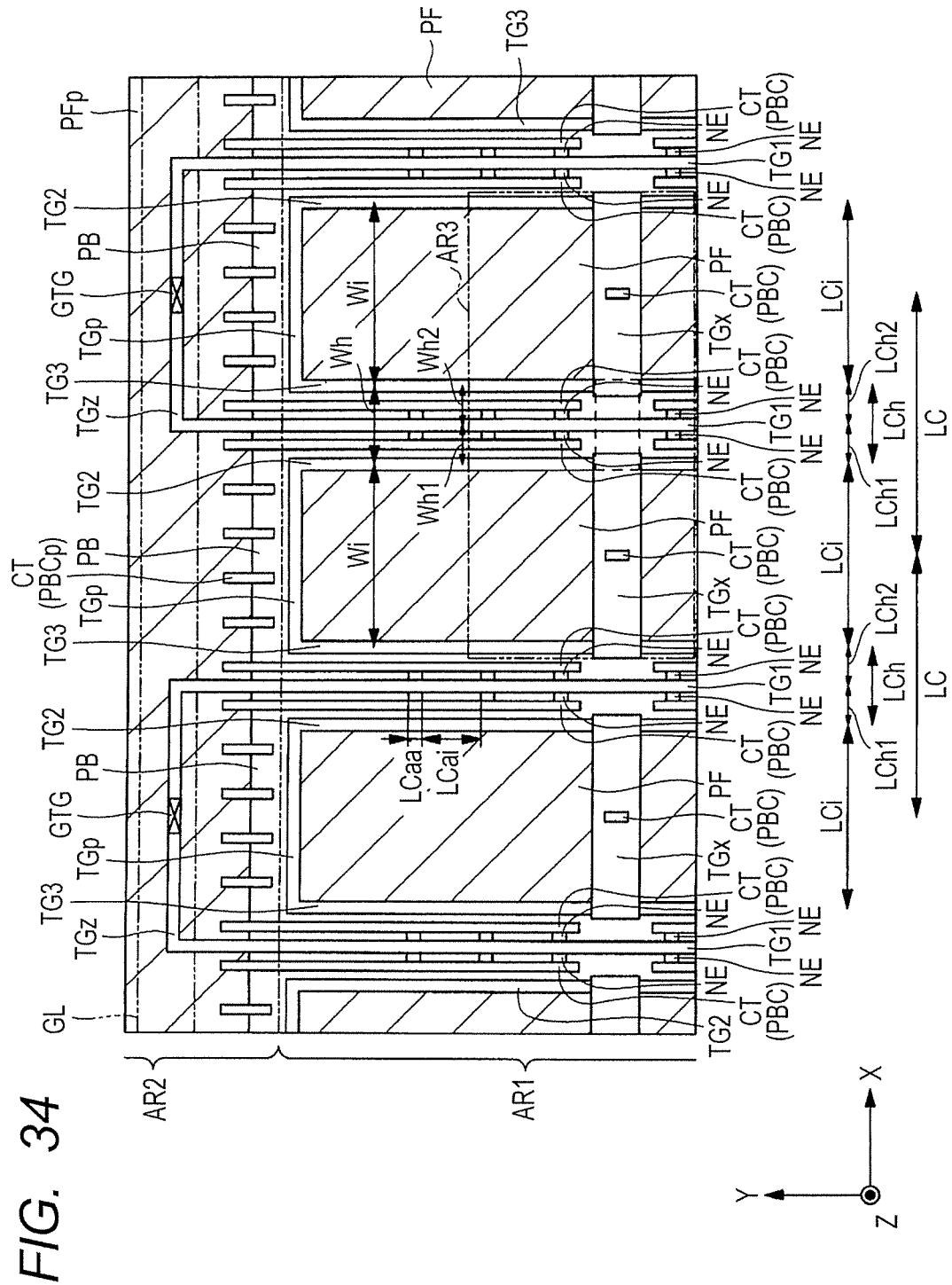
FIG. 34 is a plan view showing a configuration of the semiconductor device of the second embodiment.
Figure 35:
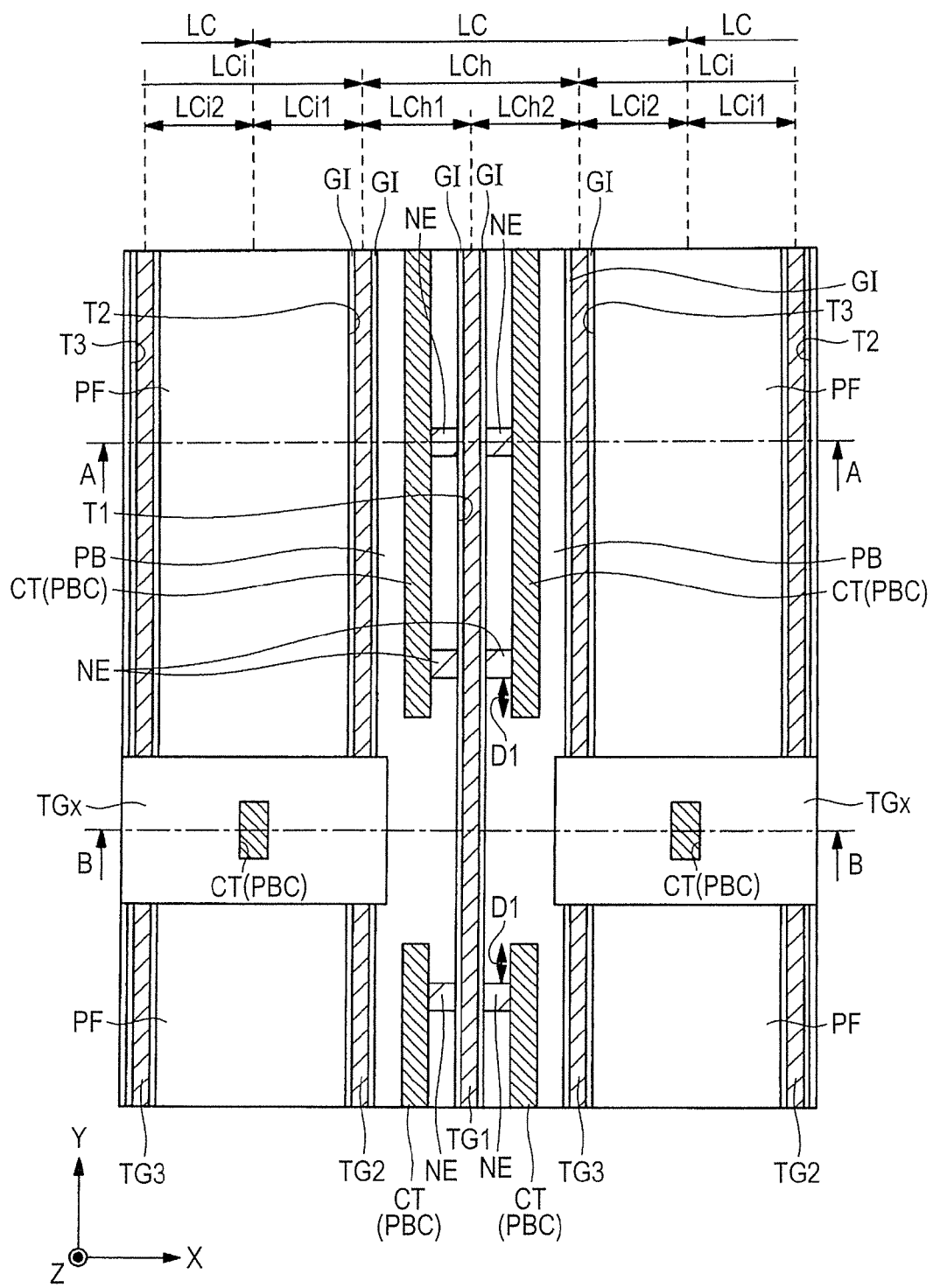
FIG. 35 is a plan view showing a configuration of the semiconductor device of the second embodiment.

FIG. 33 is a cross-sectional view showing a configuration of a semiconductor device of the present embodiment, and FIG. 34 and FIG. 35 are plan views showing a configuration of the semiconductor device of the present embodiment. Also, in the semiconductor device of the present embodiment, the configuration other than the trench gate electrodes TG2, TG3 is generally same with that of the case of the first embodiment.

As shown in FIG. 33, in the present embodiment, although the trench gate electrodes TG1, TG2 are respectively embedded in the bottom part of the trenches T2, T3 which are formed in the semiconductor substrate SS, the upper surface thereof is in a position lower than the upper surface of the trench gate electrode TG1. Also, in the upper part of the trench gate electrodes TG1, TG2 and the inside of the trenches T2, T3, the interlayer insulating film IL is embedded.

With such configuration, even when self-shrink is executed, deterioration of the switching-on loss attributable to increase of the gate capacitance can be avoided, and the low-noise performance can be maintained by presence of the parasitic PMOS transistor of the drain offset structure.

In concrete terms, in the semiconductor device shown in FIG. 33, the parasitic PMOS transistor is included therein. To be more specific, the parasitic PMOS transistor is formed in which the p-type floating region PF is made as a source, the n$^-$-type drift region ND and the n-type hole barrier region NHB are made as a channel, the p⁺-type latch-up preventing region PLP and the p⁺-type body contact region PBC are made as a drain, and the trench gate electrodes TG2, TG3 are made as a gate.

Therefore, in such semiconductor device, when the holes are injected to the p-type floating region PF, the electric potential of the source of the parasitic PMOS transistor becomes high, and the electric potential difference of minus is generated between the gate and the source of the parasitic PMOS transistor. As a result, the parasitic PMOS transistor is turned on, and the holes injected to the p-type floating region PF are discharged to the drain of the parasitic PMOS transistor.

Because the holes injected to the p-type floating region PF are discharged from the p⁺-type latch-up preventing region PLP and the p⁺-type body contact region PBC as described above, there is a feature that excessive holes hardly remain within the p-type floating region PF in the transitional state at the time of the switching operation. Thus, because uncontrollable electric potential fluctuation of the p-type floating region PF in the transitional state can be suppressed, the semiconductor device is excellent in the low-noise performance (this is similar in the case of the first embodiment (FIG. 1)).

However, in the semiconductor device shown in the first embodiment (FIG. 1) for example, when the cell shrink proceeds, although the capacitance (feedback capacitance) between the gate and collector can be reduced, the capacitance (input capacitance) between the gate and emitter cannot be reduced. The capacitance between the gate and collector affects mainly the switching-off loss, and the capacitance between the gate and emitter affects mainly the switching-on loss. That is to say, when the capacitance between the gate and emitter cannot be reduced, deterioration of the switching-on loss occurs.

Therefore, the height of the upper surface of the trench gate electrodes TG2, TG3 (the distance from the lower end to the upper surface of the trenches T2, T3) is adjusted. To be more specific, the upper surface of the trench gate electrodes TG2, TG3 is made lower than the upper surface of the trench gate electrode TG1, and is made lower than the bottom surface of the p-type body region PB.

Thus, with respect to the trench gate electrodes TG2, TG3, because the area contributing to the input capacitance can be reduced, the input capacitance can be reduced.

As described above, even when the cell shrink is executed, while avoiding deterioration of the switching-on loss attributable to increase of the gate capacitance (particularly the capacitance (input capacitance) between the gate and emitter), the low-noise performance also can be maintained by presence of the parasitic PMOS transistor of the drain offset structure.

Out of the trench gate electrodes TG2, TG3, the portions where the upper surface thereof is positioned lower than the upper surface of the trench gate electrode TG1 are the black out regions of FIG. 34 and FIG. 5 for example. Thus, in addition to the trench gate electrodes TG2, TG3, the upper surface of the end trench gate electrode TGp also may be lowered.

Figure 36:
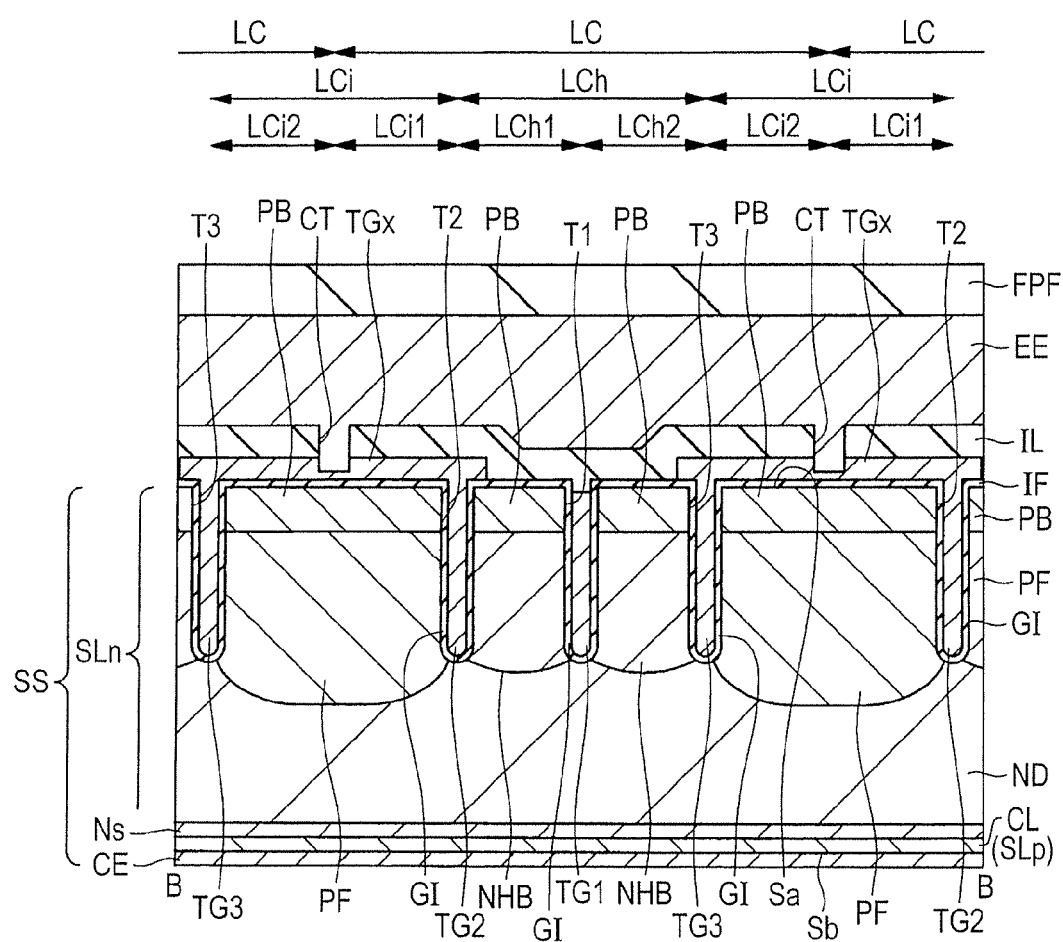
FIG. 36 is a cross-sectional view (B-B) showing a configuration of the semiconductor device of the second embodiment.

However, as shown in FIG. 35, the trench gate electrodes TG2, TG3 are electrically coupled with each other by the emitter coupling section TGx that extends in X direction. Therefore, in the emitter coupling section TGx, each of the trench gate electrodes TG2, TG3 for example is formed of the conductive film that is embedded to the upper part of the trenches T2, T3 (FIG. 36). FIG. 36 is a cross-sectional view showing a configuration of the semiconductor device of the present embodiment. FIG. 36 corresponds to the cross section B-B of FIG. 3 for example.

Also, in the present embodiment, similarly to the case of the first embodiment, the contact trench CT that comes in contact with the n⁺-type emitter region NE is disposed dividedly so as to avoid the crossing region of the extending regions of the hybrid cell region LCh and the emitter coupling section TGx (FIG. 34, FIG. 35). With such configuration, as explained in detail in the first embodiment, the working failure of the contact trench CT attributable to the unevenness caused by the emitter coupling section TGx can be avoided.

Also, in the present embodiment, similarly to the case of the first embodiment, the n⁺-type emitter region NE is disposed so as to be apart from the end of the contact trench CT by the distance D1 (FIG. 34, FIG. 35). With such configuration, as explained in detail in the first embodiment, formation of the parasitic NPN-Bipolar transistor can be avoided, the on-operation of the parasitic NPN-Bipolar transistor can be suppressed, and the breakdown resistance of the semiconductor device can be improved.

Further, in the present embodiment also, it is preferable that the distance D1 between the n⁺-type emitter region NE and the end of the contact trench CT is made 1 μm or more.

[Explanation of Manufacturing Method]

Figure 37:
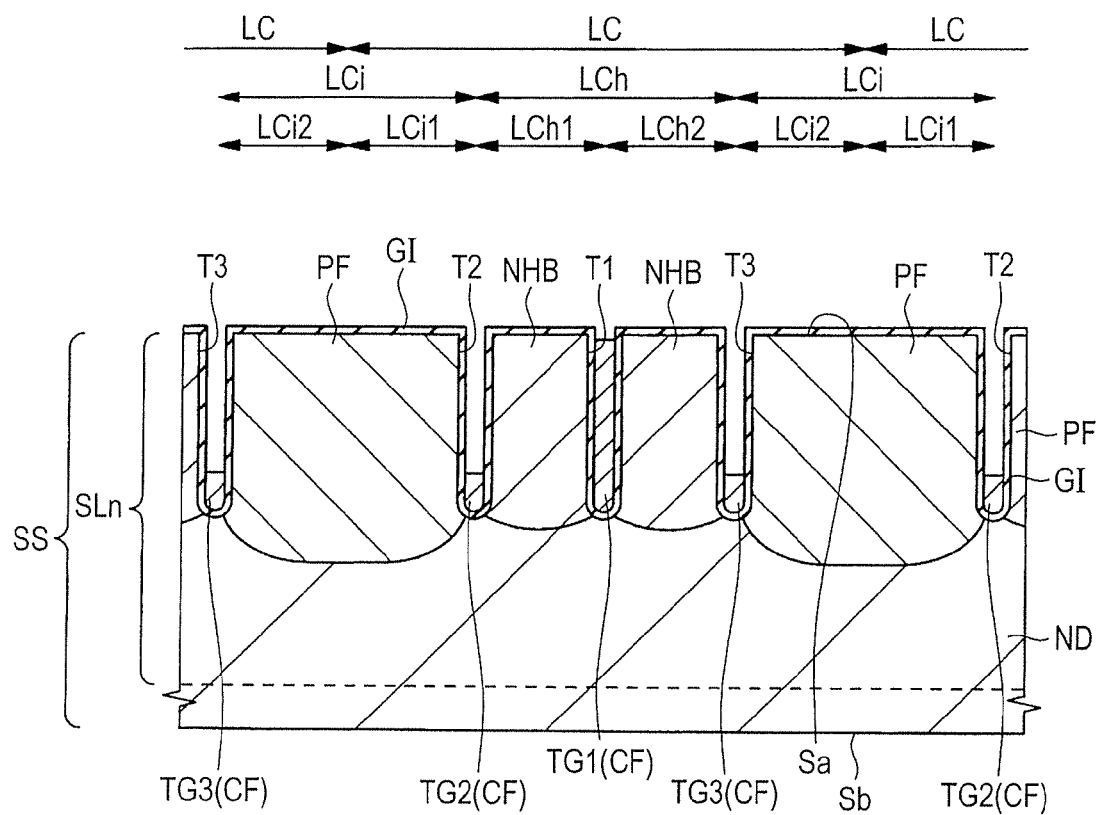
FIG. 37 is a cross-sectional view showing a manufacturing step of the semiconductor device of the second embodiment.

FIG. 37 is a cross-sectional view showing a manufacturing step of the semiconductor device of the present embodiment. Also, the manufacturing step of the semiconductor device of the present embodiment is generally similar to that of the case of the first embodiment with the exception that an etching step for the upper surface of the trench gate electrodes TG2, TG3 is added.

To be more specific, after going through the steps similar to those of the first embodiment shown in FIG. 9-FIG. 16, as shown in FIG. 17 and FIG. 18, the conductive film CF in the inside of the trenches T1, T2, and T3 and the upper part thereof is patterned by dry etching and the like. Thus, the trench gate electrode TG1 formed of the conductive film CF embedded in the inside of the trench T1 through the gate insulating film GI and the emitter coupling section TGx are formed (refer to FIG. 2, FIG. 3). At this time, in the inside of the trench T2, the conductive film CF is embedded up to the upper part thereof through the gate insulating film GI. Also, in the inside of the trench T3, the conductive film CF is embedded up to the upper part thereof through the gate insulating film GI.

Next, as shown in FIG. 37, a resist film (not illustrated) that includes openings in the forming regions of the trench gate electrodes TG2, TG3 (namely the black out regions of FIG. 34 and FIG. 35) is formed, and the conductive film CF is etched using this resist film as a mask. Thus, the upper part of the conductive film CF of the inside of the trenches T2, T3 is removed, and the upper surface of the trench gate electrodes TG2, TG3 can be lowered.

Thereafter, by the steps generally similar to those of the first embodiment shown in FIG. 19-FIG. 32 and the like, the semiconductor device of the present embodiment is completed.

Further, although there is no limitation in the product to which the semiconductor devices explained in the first and second embodiments described above are applied, such semiconductor devices can be applied to on-vehicle and industrial-use semiconductor devices for example. With respect to the on-vehicle and industrial-use semiconductor devices, because the loaded short-circuit resistance is emphasized, it is effective to use the semiconductor devices of the embodiments described above. Also, with respect to the on-vehicle and industrial-use semiconductor devices, because the reverse-bias safe operability is required, it is effective to use the semiconductor devices of the embodiments described above. Particularly, the semiconductor devices of the embodiments described above are effective when they are applied to a semiconductor device for the use of high voltage resistance and coping with a large current (for example 600 V or more, 100 A or more).

Although the invention achieved by the present inventors has been explained above specifically based on the embodiments, it is needless to mention that the present invention is not limited to the embodiments and various alterations are possible within a scope not deviating from the substances thereof.

What is claimed is:

1. A semiconductor device, comprising:
   a semiconductor substrate that includes a first main surface and a second main surface opposing the first main surface;
   a first semiconductor region of a first conductivity type arranged on the second main surface side of the semiconductor substrate;
   a second semiconductor region of a second conductivity type that is opposite to the first conductivity type arranged on the first main surface side of the semiconductor substrate and above the first semiconductor region;
   a first trench, a second trench that is arranged so as to be apart from the first trench, and a third trench that is arranged so as to be apart from the second trench, the first trench, the second trench, and the third trench penetrating the second semiconductor region and reaching the first semiconductor region;
   a third semiconductor region of the first conductivity type arranged inside the second semiconductor region and being in contact with a first side surface of the first trench;
   a first gate electrode arranged in the inside of the first trench through a first insulating film;
   a second gate electrode arranged in the inside of the second trench through a second insulating film;
   a third gate electrode arranged in the inside of the third trench through a third insulating film;
   a coupling section that couples the second gate electrode and the third gate electrode with each other;
   a fourth insulating film arranged in a first region between the first trench and the second trench and a second region between the second trench and the third trench;
   a first opening that penetrates the fourth insulating film and is in contact with the third semiconductor region; and
   a first electrode that is coupled with the third semiconductor region through the first opening,
   wherein the first region extends in a first direction,
   wherein the first gate electrode, the second electrode, and the third gate electrode extend in the first direction,
   wherein the coupling section extends in a second direction that crosses the first direction,
   wherein the first opening is divided in a crossing region of extending directions of the first region and the coupling section,
   wherein the first opening includes a first section that is arranged on one side of the crossing region and a second section that is arranged on the other side of the crossing region in the first region, and
   wherein the first opening is not arranged in the crossing region.

2. The semiconductor device according to claim 1,
   wherein the third semiconductor region is spaced apart from an end of the first section out of the first opening.
3. The semiconductor device according to claim 2,
   wherein a distance between the third semiconductor region and the end of the first section is 1 µm or more.
4. The semiconductor device according to claim 2,
   wherein the third semiconductor region includes a plurality of regions spaced apart from each other by a first distance in the first direction.
5. The semiconductor device according to claim 2,
   wherein the third semiconductor region is not disposed on a side surface side of the second trench which opposes the first side surface of the first trench.
6. The semiconductor device according to claim 2, further comprising:
   a second opening that penetrates the fourth insulating film and is in contact with the coupling section,
   wherein the first electrode is coupled with the coupling section through the second opening.
7. The semiconductor device according to claim 6, further comprising:
   a fourth semiconductor region of the second conductivity type which is arranged on the second main surface side of the semiconductor substrate and below the first semiconductor region; and
   a second electrode that is coupled with the fourth semiconductor region.
8. The semiconductor device according to claim 7, further comprising:
   a fifth semiconductor region of the first conductivity type which is arranged between the second semiconductor region and the first semiconductor region of the first region.
9. The semiconductor device according to claim 8,
   wherein the first opening reaches the second semiconductor region, and
   wherein a sixth semiconductor region of the second conductivity type is provided at the bottom of the first opening.
10. The semiconductor device according to claim 9, further comprising:
    a seventh semiconductor region of the second conductivity type which is arranged between the second semiconductor region and the first semiconductor region of the second region.
11. The semiconductor device according to claim 2,
    wherein a width of the first region is narrower than half a width of the second region.
12. The semiconductor device according to claim 2,
    wherein a surface of the fourth insulating film in the first region includes a portion that is lower than a portion of the surface of the fourth insulating film in the second region in the crossing region.
13. The semiconductor device according to claim 2,
    wherein an upper surface of the second gate electrode includes a portion that is lower than an upper surface of the first gate electrode in one side of the coupling section.
14. A method for manufacturing a semiconductor device, comprising the steps of:
    (a) providing a semiconductor substrate that includes a first main surface and a second main surface opposing the first main surface, and includes a first semiconductor region of a first conductivity type at least on the second main surface side;

(b) forming a first trench, a second trench that is arranged so as to be apart from the first trench, and a third trench that is arranged so as to be apart from the second trench, the first trench, the second trench, and the third trench reaching the middle of the semiconductor substrate;

(c) forming a first conductive film over the semiconductor substrate including the inside of the first trench, the second trench, and the third trench through a gate insulating film;

(d) forming a first gate electrode in the inside of the first trench through a first gate insulating film, forming a second gate electrode in the inside of the second trench through a second gate insulating film, and forming a third gate electrode in the inside of the second trench through a third gate insulating film by etching the first conductive film, and forming a coupling section that couples the second gate electrode and the third gate electrode with each other;

(e) forming a second semiconductor region of a second conductivity type that is opposite to the first conductivity type on the first main surface side of a first region between the first trench and the second trench and a second region between the second trench and the third trench;

(f) forming a third semiconductor region of the first conductivity type within the second semiconductor region of the first region so as to come in contact with the first gate insulating film;

(g) forming an interlayer insulating film over the first region and the second region;

(h) forming a first opening that comes in contact with the third semiconductor region by etching the interlayer insulating film; and (i) forming a first electrode by forming a second conductive film over the interlayer insulating film including the inside of the first opening, wherein, in the step (c), the first trench, the second trench, and the third trench are formed so as to extend in a first direction, wherein, in the step (d), the coupling section is formed so as to extend in a second direction that crosses the first direction, and wherein, in the step (h), the first opening is formed so as to be divided in a crossing region of extending directions of the first region and the coupling section and to include a first section that is arranged on one side of the crossing region and a second section that is arranged on the other side of the crossing region in the first region, and the first opening is not arranged in the crossing region.

15. The method for manufacturing a semiconductor device according to claim 14, wherein the third semiconductor region is disposed so as to be apart from an end of the first section out of the first opening.

16. The method for manufacturing a semiconductor device according to claim 15, wherein a distance between the third semiconductor region and the end of the first section is 1 µm or more.

17. The method for manufacturing a semiconductor device according to claim 15, wherein the third semiconductor region includes a plurality of regions spaced apart from each other by a first distance in the first direction.

18. The method for manufacturing a semiconductor device according to claim 15, wherein a width of the first region is narrower than half a width of the second region.

19. The method for manufacturing a semiconductor device according to claim 15, wherein, in the step (g), a surface of the interlayer insulating film in the first region includes a portion that is lower than a portion of the surface of the interlayer insulating film in the second region in the crossing region.

20. The method for manufacturing a semiconductor device according to claim 15, wherein, in the step (d), the first conductive film is etched so that an upper surface of the second gate electrode becomes lower than an upper surface of the first gate electrode in one side of the coupling section.

* * * * *